US012805388B2

(12) United States Patent
Lin et al.

(10) Patent No.: US 12,805,388 B2
(45) Date of Patent: Nov. 17, 2026

(54) OPTICAL DEVICE

(71) Applicant: Advanced Semiconductor Engineering, Inc., Kaohsiung (TW)

(72) Inventors: Jr-Wei Lin, Kaohsiung (TW); Mei-Ju Lu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 1049 days.

(21) Appl. No.: 17/856,893

(22) Filed: Jul. 1, 2022

(65) Prior Publication Data

US 2024/0006396 A1 Jan. 4, 2024

(51) Int. Cl.

*H10W 90/00* (2026.01)
*G02B 6/42* (2006.01)
*H10W 40/00* (2026.01)
*H10W 70/60* (2026.01)
*H10W 70/65* (2026.01)
*H10W 74/10* (2026.01)
*H10W 74/15* (2026.01)

(52) U.S. Cl.

CPC .......... *H10W 90/00* (2026.01); *G02B 6/4249* (2013.01); *G02B 6/4268* (2013.01); *H10W 40/00* (2026.01); *H10W 70/611* (2026.01); *H10W 70/65* (2026.01); *H10W 74/111* (2026.01); *H10W 90/401* (2026.01); *H10W 90/701* (2026.01); *H10W 74/15* (2026.01); *H10W 90/724* (2026.01)

(58) Field of Classification Search

CPC ... H01L 25/167; H01L 23/3107; H01L 23/34; H01L 23/49811; H01L 23/5385; H01L 23/5386; H01L 24/16; H01L 24/73; H01L 2224/16225; H01L 2224/73204; G02B 6/4249; G02B 6/4268

See application file for complete search history.

(56) References Cited

U.S. PATENT DOCUMENTS 8,097,956 B2 * 1/2012 von Kaenel .......... H01L 25/105 257/777
8,470,613 B2 * 6/2013 von Kaenel .......... H01L 25/105 257/E21.531
9,190,379 B2 * 11/2015 Arnold .................... H01L 24/19
9,236,355 B2 * 1/2016 Zhai ...................... H01L 23/552
9,318,474 B2 * 4/2016 Zhai ........................ H01L 25/50
9,367,094 B2 * 6/2016 Bibl ...................... H01L 25/167
9,548,288 B1 * 1/2017 Ramachandran ....... H01L 25/16
9,559,081 B1 * 1/2017 Lai ...................... H01L 25/0657
9,582,036 B2 * 2/2017 Bibl ...................... H01L 25/167

(Continued)

*Primary Examiner* — Peter Radkowski
(74) *Attorney, Agent, or Firm* — Foley & Lardner LLP

(57) ABSTRACT

An optical device is provided. The optical device includes a processing component, a first electronic component, a second electronic component, a first pillar, and an encapsulant. The first electronic component is disposed over and electrically connected to the processing component. The second electronic component is disposed over the processing component and electrically connected to the first electronic component. The first pillar is disposed between the first electronic component and the second electronic component and electrically connected to the processing component. The encapsulant is disposed over the processing component. The encapsulant encapsulates the first electronic component, the second electronic component, and the first pillar.

20 Claims, 19 Drawing Sheets

3A

(56) References Cited

U.S. PATENT DOCUMENTS 9,583,472 B2 * 2/2017 Chung ................ H01L 23/5389
9,589,936 B2 * 3/2017 Zhai ...................... H01L 21/561
9,601,471 B2 * 3/2017 Zhai ...................... H01L 25/105
9,633,974 B2 * 4/2017 Zhai ...................... H01L 21/568
9,659,907 B2 * 5/2017 Zhai ...................... H01L 21/561
9,679,801 B2 * 6/2017 Lai .......................... H01L 25/50
9,691,701 B2 * 6/2017 Zhai .......................... H10D 1/20
9,721,903 B2 * 8/2017 Lee ....................... H01L 23/552
9,847,284 B2 * 12/2017 Zhai ...................... H01L 23/498
9,922,966 B2 * 3/2018 Bibl ...................... H01L 25/167
9,935,087 B2 * 4/2018 Zhai ...................... H01L 25/105
10,056,327 B2 * 8/2018 Zhai .......................... H10D 1/20
10,115,677 B2 * 10/2018 Lee ....................... H01L 23/552
10,147,711 B2 * 12/2018 Bibl ...................... H01L 25/167
10,181,455 B2 * 1/2019 Zhai .................... H01L 25/0657
10,483,253 B1 * 11/2019 Hu ...................... H01L 23/5389
10,522,475 B2 * 12/2019 Lee ....................... H01L 23/552
10,535,642 B2 * 1/2020 Bibl ...................... H01L 25/167
10,602,612 B1 * 3/2020 Hoang ................... H05K 3/284
10,624,214 B2 * 4/2020 Salehi .................. H05K 1/0224
10,631,410 B2 * 4/2020 Provencher .......... H05K 3/0014
10,742,217 B2 * 8/2020 Dabral .................... H01L 24/20
10,756,622 B2 * 8/2020 Dabral ...................... G05F 3/10
10,770,433 B1 * 9/2020 Zhong ................... H01L 25/105
10,872,854 B2 12/2020 Raghunathan et al.
10,886,263 B2 * 1/2021 Chen ................... H01L 23/5384
10,943,869 B2 * 3/2021 Zhai ........................ H01L 24/19
10,950,591 B2 * 3/2021 Hu ........................ H01L 25/167
10,957,678 B2 * 3/2021 Bibl ...................... H01L 25/167
10,962,728 B2 3/2021 Nelson et al.
10,993,317 B2 * 4/2021 He ........................ H01L 25/167
11,056,373 B2 * 7/2021 Zhai .................... H01L 23/5389
11,063,013 B2 * 7/2021 Chen ................... H01L 23/5386
11,069,665 B2 * 7/2021 Ramachandran ....... H01L 22/20
11,088,125 B2 * 8/2021 Lai ...................... H01L 21/6835
11,121,052 B2 * 9/2021 Lai .......................... H01L 23/32
11,183,474 B2 * 11/2021 Lu ...................... H01L 25/0657
11,257,763 B2 * 2/2022 Lu ...................... H01L 23/5384
11,309,895 B2 * 4/2022 Dabral .................... H01L 24/20
11,313,741 B2 * 4/2022 Lupo ...................... G01K 13/20
11,322,453 B2 * 5/2022 Hsu ..................... H01L 21/6835
11,347,001 B2 * 5/2022 Chen ........................ G02B 6/30
11,362,076 B2 * 6/2022 Bibl ...................... H01L 25/167
11,374,381 B1 * 6/2022 Kriman ................ H10H 20/853
11,395,408 B2 * 7/2022 Morrison ............... H05K 1/181
11,462,461 B2 * 10/2022 Zhang ............... H01L 23/49816
11,515,261 B2 * 11/2022 Shanmugam ......... H01L 21/568
11,532,563 B2 * 12/2022 Shanmugam ....... H01L 23/5389
11,587,909 B2 * 2/2023 Zhong ................... H01L 25/105
11,594,494 B2 * 2/2023 Zhai ........................ H01L 24/19
11,651,976 B2 * 5/2023 Renjan .................. H01L 23/295 257/676
11,676,953 B2 * 6/2023 Bibi ...................... H01L 25/167 257/82
11,694,939 B2 * 7/2023 Huang ................ H01L 23/3185 257/787
11,728,266 B2 * 8/2023 Dabral .................. H01L 23/522 257/737
11,764,123 B2 * 9/2023 Huang ................ H01L 23/3185 257/787
11,798,925 B2 * 10/2023 Lai ...................... H01L 21/6835
11,817,383 B2 * 11/2023 Lupo ...................... G01K 13/20
11,824,029 B2 * 11/2023 Chen ................... H01L 23/5386
11,831,312 B2 * 11/2023 Dabral .................... H01L 24/20
11,837,566 B2 * 12/2023 Lu ...................... H01L 25/0657
11,846,802 B2 * 12/2023 Chen .................... G02B 6/4295
11,881,678 B1 * 1/2024 Bishop .................... H01S 5/405
12,046,558 B2 * 7/2024 Lu ...................... H01L 23/5384
12,074,077 B2 * 8/2024 Shanmugam ......... H01L 21/568
12,074,244 B2 * 8/2024 Liu ....................... G06F 1/1635
12,087,749 B2 * 9/2024 Bibl ...................... H01L 25/167
12,119,304 B2 * 10/2024 Dabral ................ H01L 23/5384
12,197,023 B1 * 1/2025 Aggarwal ............ G02B 6/4255
12,210,187 B2 * 1/2025 Chen ................... H01L 23/5386
12,283,549 B2 * 4/2025 Zhai ........................ H01L 24/19
12,368,137 B2 * 7/2025 Zhong ................... H01L 25/105
12,368,141 B2 * 7/2025 Lai ...................... H01L 21/6835
12,392,974 B2 * 8/2025 Aggarwal ................ G02B 6/32
12,405,434 B2 * 9/2025 Aggarwal .............. G02B 6/124
12,431,453 B2 * 9/2025 Lu ...................... H01L 25/0657
2010/0230825 A1 * 9/2010 von Kaenel .......... H01L 25/105 257/777
2012/0083052 A1 * 4/2012 von Kaenel .......... H01L 25/105 257/E21.531
2014/0029639 A1 * 1/2014 Zarbock ............... G02B 6/4214 372/50.1
2014/0084425 A1 * 3/2014 Arnold .................... H01L 24/19 257/738
2014/0210106 A1 * 7/2014 Zhai .................... H01L 23/3128 438/118
2014/0210107 A1 * 7/2014 Zhai ...................... H01L 23/498 257/777
2015/0169011 A1 * 6/2015 Bibl ...................... H01L 25/167 345/175
2015/0171063 A1 * 6/2015 Zhai ........................ H01L 25/50 257/713
2015/0296622 A1 * 10/2015 Jiang ...................... H05K 1/028 361/749
2015/0303149 A1 * 10/2015 Zhai ...................... H01L 23/552 257/659
2016/0148904 A1 * 5/2016 Zhai ...................... H01L 21/561 438/109
2016/0259368 A1 * 9/2016 Bibl ...................... H01L 25/167
2016/0260684 A1 * 9/2016 Zhai ...................... H01L 21/568
2016/0260695 A1 * 9/2016 Chung ................ H01L 23/5389
2016/0270213 A1 * 9/2016 Salehi .................... B33Y 80/00
2016/0300813 A1 * 10/2016 Zhai ...................... H01L 21/561
2016/0315071 A1 * 10/2016 Zhai ...................... H01L 25/105
2016/0358889 A1 * 12/2016 Lai .......................... H01L 25/50
2017/0018497 A1 * 1/2017 Zhai .......................... H10D 1/20
2017/0025380 A1 * 1/2017 Zhai .................... H01L 23/5389
2017/0053897 A1 * 2/2017 Lai ...................... H01L 25/0657
2017/0133351 A1 * 5/2017 Su ......................... H01L 25/105
2017/0141088 A1 * 5/2017 Zhai ...................... H01L 25/105
2017/0141091 A1 * 5/2017 Bibl ...................... H01L 25/167
2017/0179039 A1 * 6/2017 Lee ....................... H01L 23/552
2017/0256489 A1 * 9/2017 Zhai .......................... H10D 1/20
2017/0301631 A1 * 10/2017 Lee ....................... H01L 23/552
2018/0092213 A1 * 3/2018 Provencher .......... H05K 3/0014
2018/0190632 A1 * 7/2018 Bibl ...................... H01L 25/167
2018/0204820 A1 * 7/2018 Zhai .................... H01L 25/0657
2018/0358298 A1 * 12/2018 Zhai ........................ H01L 24/19
2019/0027445 A1 * 1/2019 Lee ....................... H01L 23/552
2019/0043845 A1 * 2/2019 Bibl ...................... H01L 25/167
2019/0103386 A1 * 4/2019 Chen ................... H01L 23/5384
2019/0319626 A1 * 10/2019 Dabral .................... H01L 24/20
2020/0107435 A1 * 4/2020 He ........................ H01L 25/167
2020/0161288 A1 * 5/2020 Bibl ...................... H01L 25/167
2020/0176427 A1 * 6/2020 Ramachandran ....... H01L 22/14
2020/0204067 A1 * 6/2020 Dabral ...................... G05F 3/10
2020/0251397 A1 * 8/2020 Lai .......................... H01L 23/32
2020/0258875 A1 * 8/2020 Hu ........................ H01L 25/167
2020/0273843 A1 * 8/2020 Zhong ................... H01L 25/105
2020/0365544 A1 * 11/2020 Chen ................... H01L 23/5386
2020/0389172 A1 * 12/2020 Dabral .................... H01L 24/20
2021/0020610 A1 * 1/2021 Zhong ................... H01L 25/105
2021/0082888 A1 * 3/2021 Lai ...................... H01L 21/6835
2021/0090908 A1 * 3/2021 Renjan .................. H01L 23/295
2021/0096310 A1 * 4/2021 Chang .................. G02B 6/4274
2021/0134751 A1 * 5/2021 Lu ...................... H01L 25/0657
2021/0159180 A1 * 5/2021 Zhai ........................ H01L 24/19
2021/0159185 A1 * 5/2021 Hsu ..................... H01L 21/6835
2021/0167016 A1 * 6/2021 Lu ...................... H01L 23/5384
2021/0175189 A1 * 6/2021 Kung .................. H01L 21/6835
2021/0181039 A1 * 6/2021 Lupo ...................... G01K 13/20
2021/0225824 A1 * 7/2021 Islam .................... H01L 25/167
2021/0265330 A1 * 8/2021 Bibl ...................... H01L 25/167
2021/0311252 A1 * 10/2021 Chen ........................ G02B 6/30
2021/0313254 A1 * 10/2021 Chen ................. H01L 23/49503
2021/0343671 A1 * 11/2021 Chen ................... H01L 23/5386
2021/0366802 A1 * 11/2021 Huang .................. H01L 25/167
2021/0375840 A1 * 12/2021 Lai ...................... H01L 21/6835

(56) References Cited

U.S. PATENT DOCUMENTS

| | | | | |
|---|---|---|---|---|
| 2021/0384113 | A1* | 12/2021 | Zhang | H01L 23/49816 |
| 2021/0407909 | A1 | 12/2021 | Jadhav et al. | |
| 2022/0071013 | A1* | 3/2022 | Morrison | H05K 1/181 |
| 2022/0084972 | A1* | 3/2022 | Lu | H01L 25/0657 |
| 2022/0085231 | A1* | 3/2022 | Liu | G04G 17/04 |
| 2022/0093522 | A1* | 3/2022 | Shanmugam | H01L 23/5389 |
| 2022/0093523 | A1* | 3/2022 | Shanmugam | H10F 77/93 |
| 2022/0102280 | A1* | 3/2022 | Dabral | H01L 23/5384 |
| 2022/0157680 | A1* | 5/2022 | Shanmugam | H01L 21/568 |
| 2022/0181264 | A1* | 6/2022 | Lu | H01L 23/5384 |
| 2022/0199517 | A1* | 6/2022 | Dabral | H01L 23/522 |
| 2022/0231687 | A1* | 7/2022 | Dabral | H01L 24/20 |
| 2022/0260776 | A1* | 8/2022 | Chen | H01L 23/5386 |
| 2022/0270955 | A1* | 8/2022 | Lupo | G01K 13/20 |
| 2022/0278086 | A1* | 9/2022 | Bibl | H01L 25/167 |
| 2022/0336309 | A1* | 10/2022 | Huang | H01L 25/167 |
| 2023/0154897 | A1* | 5/2023 | Zhong | H01L 25/105<br>257/419 |
| 2023/0223348 | A1* | 7/2023 | Zhai | H01L 24/19<br>257/737 |
| 2023/0361098 | A1* | 11/2023 | Bibl | H01L 25/167 |
| 2023/0369303 | A1* | 11/2023 | Lai | H01L 21/6835 |
| 2024/0085619 | A1* | 3/2024 | Chen | H01L 23/5386 |
| 2024/0113061 | A1* | 4/2024 | Lu | H01L 25/0657 |
| 2024/0379567 | A1* | 11/2024 | Lu | H01L 23/5384 |
| 2024/0405005 | A1* | 12/2024 | Lai | H01L 21/6835 |

* cited by examiner

OPTICAL DEVICE

BACKGROUND

1. Technical Field

The present disclosure relates generally to an optical device.

2. Description of the Related Art

Silicon photonics and optical engines with integration of at least an electronic IC (EIC) and a photonic IC (PIC) have advantages of high transmission speed and low power loss and thus are applied in various areas. The electronic ICs or dies may be formed in a package followed by each of the electronic ICs or dies flip-chip bonding to a photonic IC or die, and an ASIC may be arranged with the electronic ICs or dies in a side-by-side fashion. Therefore, the transmission path between the electronic ICs and the ASIC may be relatively long.

SUMMARY

In one or more embodiments, an optical device includes a processing component, a first electronic component, a second electronic component, a first pillar, and an encapsulant. The first electronic component is disposed over and electrically connected to the processing component. The second electronic component is disposed over the processing component and electrically connected to the first electronic component. The first pillar is disposed between the first electronic component and the second electronic component and electrically connected to the processing component. The encapsulant is disposed over the processing component. The encapsulant encapsulates the first electronic component, the second electronic component, and the first pillar.

In one or more embodiments, an optical device includes a processing component, a first electronic component, and a plurality of second electronic components. The first electronic component is disposed over and electrically connected to the processing component. The second electronic components is disposed over and electrically connected to the processing component. The second electronic components are disposed adjacent to the first electronic component.

In one or more embodiments, an optical device includes a processing component, a first electronic component, and a first pillar. The first electronic component is disposed over and electrically connected to the processing component. The first pillar is disposed around the processing component and configured to transmit a power to the processing component and the first electronic component.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
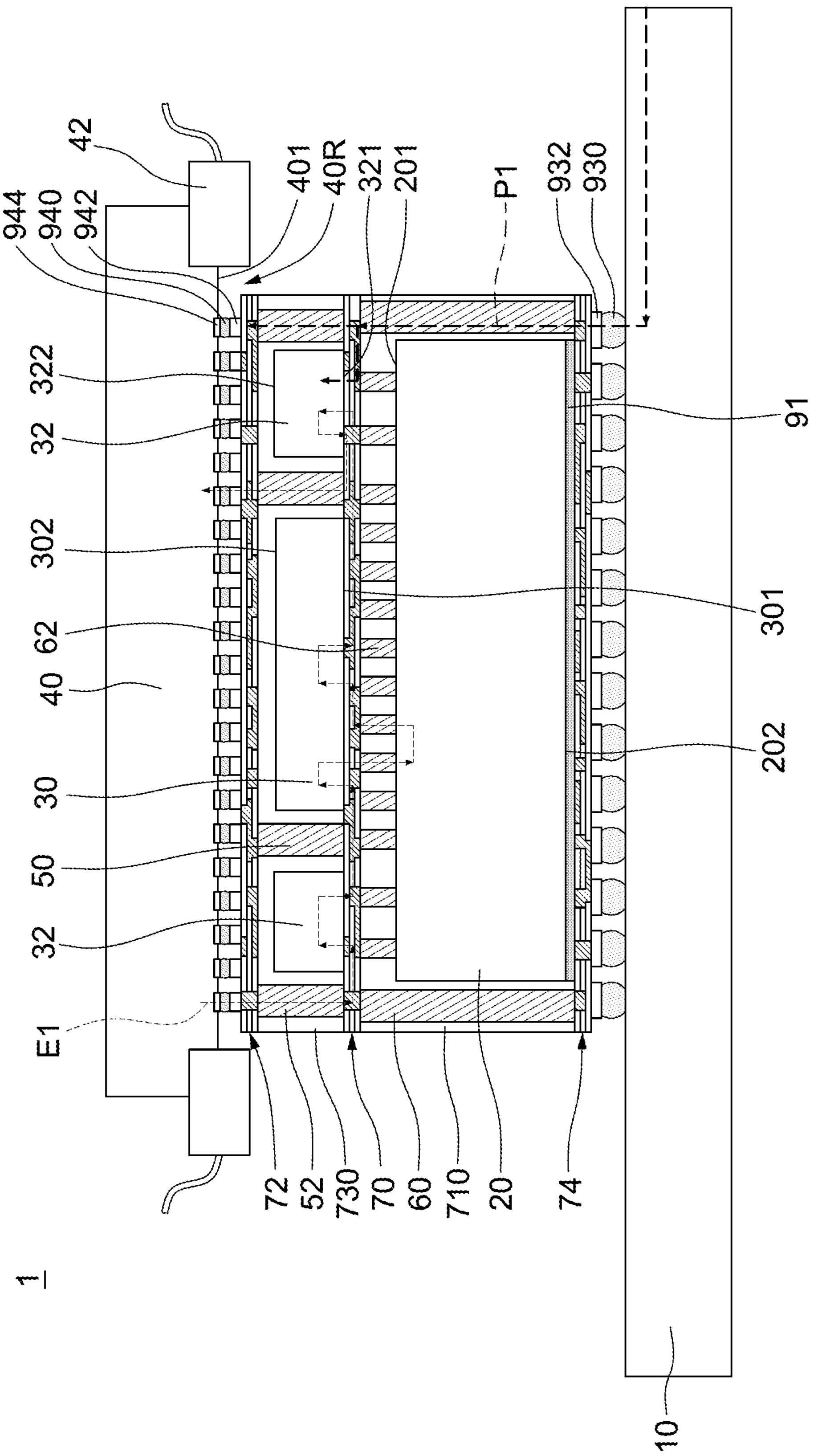
FIG. 1 illustrates a cross-sectional view of an optical device in accordance with some embodiments of the present disclosure.

FIG. 1 illustrates a cross-sectional view of an optical device 1 in accordance with some embodiments of the present disclosure. The optical device 1 includes a carrier 10, components 20, and 32, a photonic component 40, one or more optical fiber array components 42, pillars 50, 52, 60 and 62, redistribution layers (RDLs) 70, 72 and 74, an adhesive layer 91, encapsulants 710 and 730, connection elements 940, and electrical contacts 930.

The carrier 10 may include, for example, a printed circuit board, such as a paper-based copper foil laminate, a composite copper foil laminate, or a polymer-impregnated glass-fiber-based copper foil laminate. The carrier 10 may include an interconnection structure, which may include such as a plurality of conductive traces and/or a plurality of conductive vias. The interconnection structure may include a redistribution layer (RDL) and/or a grounding element. In some embodiments, the carrier 10 includes a ceramic material or a metal plate. In some embodiments, the carrier 10 may include a substrate, such as an organic substrate or a leadframe. In some embodiments, the carrier 10 may include a two-layer substrate which includes a core layer and a conductive material and/or structure disposed on an upper surface and a bottom surface of the carrier 10. The conductive material and/or structure may include a plurality of traces. The carrier may include one or more conductive pads in proximity to, adjacent to, or embedded in and exposed at an upper surface and/or a bottom surface of the carrier 10. The carrier 10 may include a solder resist (not shown) on the upper surface and/or the bottom surface of the carrier 10 to fully expose or to expose at least a portion of the conductive pads for electrical connections. In some embodiments, the carrier 10 supports the component 20.

The component 20 may be disposed over the carrier 10. In some embodiments, the component 20 includes an electronic component, such as an electronic IC (EIC). In some embodiments, the component 20 includes a processing component (e.g., ASICs, FPGAs, GPUs, or the like).

The component 30 may be disposed over the component 20. In some embodiments, the component 30 is disposed over and electrically connected to the component 20. In some embodiments, an active surface 301 of the component 30 is bonded to an active surface 201 of the component 20. In some embodiments, the component 30 includes an electronic component, such as an EIC. In some embodiments, the component 30 includes an integrated digital signal processor (DSP). The integrated DSP may include a plurality of DSP units. For example, each of the DSP units may be divided from a monolithic optical engine, and the integrated DSP includes a plurality of DSP units divided or originated from a plurality of optical engines. In some embodiments, each of the DSP units of the component 30 may electrically connect to a corresponding one of the components 32, respectively.

The optical device 1 may include one or more components 32. The component 32 may be disposed over the component 20. In some embodiments, the components 32 are disposed over and electrically connected to the component 20. In some embodiments, the components 32 are electrically connected to the component 30. In some embodiments, the components 32 are disposed adjacent to the component 30 from a top view perspective. In some embodiments, the components 32 are disposed around the component 30 from a top view perspective. In some embodiments, the components 32 are disposed adjacent to at least two sides of the component 30 from a top view perspective. In some embodiments, the components 32 surround the component 30 from a top view perspective. In some embodiments, the components 32 include electronic components, such as EICs. In some embodiments, one or more of the components 32 may include an integrated component including a plurality of electro-optical units (or chiplets). The electro-optical units may include at least one transimpedance amplifier (TIA) unit, at least one driver (DRV) unit, or a combination thereof. For example, each of the TIA units and each of the DRV units may be divided from a monolithic optical engine, and the integrated component includes a plurality of TIA units and/or DRV units divided or originated from a plurality of optical engines.

The photonic component 40 may be disposed over the component 30. The photonic component 40 may be or include a photonic IC (PIC). The photonic component 40 may include an integrated component including a plurality of photonic units. For example, each of the photonic units may be divided from a monolithic optical engine, and the integrated component includes a plurality of photonic units divided or originated from a plurality of optical engines. In some embodiments, each of the photonic units of the photonic component 40 is coupled to a corresponding one of the optical fiber array components 42, respectively. The photonic component 40 may be disposed over the component 32. In some embodiments, the photonic component 40 has a region 40R exposed by the component 30. In some embodiments, a projection of the component 30, projections of the components 32, and a projection of the component 20 are located within a range covered by the photonic component 40 from a top view perspective.

The optical fiber array component 42 may be connected to the photonic component 40. The optical fiber array component 42 may be connected to the photonic component 40 through a waveguide (not shown in FIG. 1). In some embodiments, the optical fiber array component 42 is disposed or received within the region 40R of the photonic component 40. In some embodiments, the optical fiber array component 42 includes an integrated component including a plurality of fiber array units (FAUs).

The optical device 1 may include one or more pillars 50. The pillars 50 may be conductive pillars or electrically conductive pillars. In some embodiments, the pillar 50 is disposed around the component 30. In some embodiments, the pillar 50 is adjacent to the component 30. In some embodiments, the pillar 50 is adjacent to the component 32. In some embodiments, the pillar is disposed between the component 30 and the component 32 and electrically connected to the component 20. In some embodiments, the pillar 50 is connecting to the component 20. The pillar may include a conductive material such as a metal or metal alloy. Examples include gold (Au), silver (Ag), aluminum (Al), copper (Cu), or an alloy thereof.

The optical device 1 may include one or more pillars 52. The pillars 52 may be conductive pillars or electrically conductive pillars. In some embodiments, the pillar 52 is disposed around the component 30. In some embodiments, the pillar 52 is disposed adjacent to the component 32. In some embodiments, the pillar 52 is disposed around the component 32. In some embodiments, the pillar 52 is electrically connected to the component 20. The pillar 52 may include a conductive material such as a metal or metal alloy. Examples include gold (Au), silver (Ag), aluminum (Al), copper (Cu), or an alloy thereof.

The optical device 1 may include one or more pillars 60. The pillars 60 may be conductive pillars or electrically conductive pillars. In some embodiments, the pillar 60 is disposed adjacent to the component 20. In some embodiments, the pillar 60 is disposed around the component 20. In some embodiments, the pillar 60 is electrically connected to the pillar 50. In some embodiments, the pillar 60 is electrically connected to the pillar 52. In some embodiments, the pillar 60 is configured to transmit a power. In some embodiments, the pillar 60 is configured to transmit a power to the components 20 and 30. The pillar 60 may include a conductive material such as a metal or metal alloy. Examples include gold (Au), silver (Ag), aluminum (Al), copper (Cu), or an alloy thereof.

The optical device 1 may include one or more pillars 62. The pillars 62 may be conductive pillars or electrically conductive pillars. In some embodiments, the pillar 62 is between the component 20 and the components 30 and 32. In some embodiments, the pillar 62 is electrically connected to the component 20 and the components 30 and 32. In some embodiments, the pillar 62 is configured to transmit an electrical signal between the component 20 and the component 30. The pillar 62 may include a conductive material such as a metal or metal alloy. Examples include gold (Au), silver (Ag), aluminum (Al), copper (Cu), or an alloy thereof.

The RDL 70 may be between the component 20 and the component 30. The RDL 70 may be or include a circuit layer. In some embodiments, the component 20 is electrically connected to the component 30 through the RDL 70.

The RDL 70 may be between the component 20 and the component 32. In some embodiments, the RDL 70 electrically connects the pillar 50 and the pillar 60. In some embodiments, the pillar 52 is disposed over and electrically connected to the RDL 70. In some embodiments, the RDL 70 electrically connects the pillar 52 and the pillar 60. In some embodiments, the pillar 52 connects to the pillar 60 through the RDL 70. In some embodiments, a projection of the pillar 52 at least partially overlaps a projection of the pillar 60 from a top view perspective. In some embodiments, a projection of the pillar 52 on the carrier 10 and a projection of the pillar 60 on the carrier 10 overlap from a top view perspective.

In some embodiments, the RDL 70 includes a first part and a second part. In some embodiments, the RDL 70 includes conductive patterns or conductive structures, and the first part and the second part are different ones of the conductive patterns or conductive structures of the RDL 70. For example, the RDL 70 may include a first conductive pattern (or a first conductive structure) as the first part and a second conductive pattern (or a second conductive structure) as the second part. In some embodiments, the first part of the RDL 70 is free from overlapping or contacting the second part of the RDL 70. In some embodiments, the first part of the RDL 70 is physically spaced apart from the second part of the RDL 70. In some embodiments, the first part of the RDL 70 is configured to transmit a power to the component 20 or the component 30. In some embodiments, the second part of the RDL 70 is configured to transmit an electrical signal between the component 20 and the component 30. In some embodiments, the first part of the RDL is electrically insulated from the second part of the RDL 70.

In some embodiments, an active surface 201 of the component 20 is electrically connected to the RDL 70. In some embodiments, an active surface 301 of the component 30 and an active surface 321 of the component 32 are electrically connected to the RDL 70. In some embodiments, an active surface 401 of the photonic component 40 is electrically connected to the RDL 70. In some embodiments, the pillar 62 is between the RDL 70 and the component 20. The RDL 70 may include a plurality of dielectric layers, a plurality of conductive layers in the dielectric layers, and a plurality of conductive vias connecting the conductive layers. According to some embodiments of the present disclosure, with the aforesaid design of the active surface 301 and the active surface 321 directly electrically connected to the RDL 70, an electrical transmission path between the component 30 and the component 32 can be reduced, and thus the transmission speed can be increased.

The RDL 72 may be disposed over the components 30 and 32. The RDL 72 may be or include a circuit layer. In some embodiments, a backside surface 302 (or a passive surface) of the component 30 and a backside surface 322 (or a passive surface) of the component 32 are spaced apart from the RDL 72. In some embodiments, the RDL 72 is electrically connected to the pillar 50. In some embodiments, the RDL 72 is electrically connected to the photonic component 40. In some embodiments, the RDL 72 is electrically connected to the RDL 70 through the pillar 50. In some embodiments, the pillar 50 is configured to transmit a power from the pillar 60 to the RDL 72. In some embodiments, the RDL 72 is electrically connected to the RDL 70 through the pillar 52. In some embodiments, the pillar 52 is configured to transmit a power from the pillar 60 to the RDL 72. The RDL 72 may include a plurality of dielectric layers, a plurality of conductive layers in the dielectric layers, and a plurality of conductive vias connecting the conductive layers.

The RDL 74 may be disposed under or below the component 20. The RDL 74 may be or include a circuit layer. In some embodiments, the RDL 74 is disposed between the carrier 10 and the component 20. In some embodiments, the RDL 74 is electrically connected to the pillar 60. In some embodiments, the RDL 74 is electrically connected to the RDL 72. The RDL 74 may include a plurality of dielectric layers, a plurality of conductive layers in the dielectric layers, and a plurality of conductive vias connecting the conductive layers. In some embodiments, the pillar is configured to transmit a power form the RDL 74 to the RDL 72.

The adhesive layer 91 may be between the component 20 and the carrier 10. In some embodiments, the component 20 is adhered to the RDL 74 through the adhesive layer 91. In some embodiments, the adhesive layer 91 contacts a backside surface 202 (or a passive surface) of the component 20. In some embodiments, the adhesive layer 91 directly contacts the component 20 and the RDL 74. In some embodiments, the adhesive layer 91 includes a die attach film (DAF). In some embodiments, the adhesive layer 91 includes a thermal interface material (TIM). In some embodiments, the RDL 74 includes dummy conductive portions (e.g., dummy conductive patterned layers, dummy conductive vias, dummy conductive pads, or the like) that are free from electrically connecting to any component. In some embodiments, the dummy conductive portions of the RDL 74 are directly under the adhesive layer 91. In some embodiments, the dummy conductive portions of the RDL 74 directly contact the adhesive layer 91.

The encapsulant 710 may be between the RDL 70 and the RDL 74. In some embodiments, the encapsulant 710 covers or encapsulates the component 20 and the pillars 60 and 62. The encapsulant 710 may include an epoxy resin having fillers, a molding compound (e.g., an epoxy molding compound or other molding compound), polyimide, a phenolic compound or material, a material with a silicone dispersed therein, or a combination thereof.

The encapsulant 730 may be disposed over the component 20. The encapsulant 730 may be between the RDL 70 and the RDL 72. In some embodiments, the encapsulant 730 covers or encapsulates the components 30 and 32 and the pillars 50 and 52. The encapsulant 730 may include an epoxy resin having fillers, a molding compound (e.g., an epoxy molding compound or other molding compound), polyimide, a phenolic compound or material, a material with a silicone dispersed therein, or a combination thereof.

The electrical contacts 930 may be between the carrier 10 and the component 20. In some embodiments, the electrical contacts 930 electrically connect the RDL 74 to the carrier 10. In some embodiments, the electrical contacts 930 electrically connect to the RDL 74 through conductive pads 932. The electrical contacts 930 may include controlled collapse chip connection (C4) bumps, a ball grid array (BGA) or a land grid array (LGA). The conductive pads 932 may include one or more conductive materials such as a metal or metal alloy. Examples include gold (Au), silver (Ag), aluminum (Al), copper (Cu), or an alloy thereof.

The connection elements 940 may be between the photonic component 40 and the components 30 and 32. In some embodiments, the connection elements 940 electrically connect the photonic component 40 to the RDL 72. In some embodiments, the connection elements 940 electrically connect the photonic component 40 to the RDL 72 through conductive pads 942 and 944. The connection elements 940 may include conductive bumps. The connection elements 940 and the conductive pads 942 and 944 may include one or more conductive materials such as a metal or metal alloy. Examples include gold (Au), silver (Ag), aluminum (Al), copper (Cu), or an alloy thereof.

In some embodiments, the pillar 60 is configured to provide a power path P1. In some embodiments, the power path P1 passes through the carrier 10, the RDL 74, and the pillar 60. In some embodiments, the power path P1 further passes through the electrical contacts 930 and the conductive pads 932. In some embodiments, the power path P1 passes through the pillars 60 and 52. In some embodiments, the power path P1 passes through the pillars 60 and 50. In some embodiments, the power path P1 further passes through the first part of the RDL 70. The power path P1 may be configured to supply or transmit power to the components 20, 30, and 32. The power path P1 may further pass through the connection element 940 to supply or transmit power to the photonic component 40.

In some embodiments, the RDL 70 is configured to provide vertical electrical connection between the component 20 (e.g., ASIC) and the components 30 and 32 (e.g., EICs) stacked over the component 20. In some embodiments, the RDL 70 (e.g., the second part of the RDL 70) is configured to provide a signal path E1. In some embodiments, the signal path E1 passes through the second part of the RDL 70 and the pillar 62. An electrical signal may be transmitted between the component 20 (e.g. ASIC) and the component 30 (e.g., DSP) through the signal path E1.

In some embodiments, the signal path E1 passes through the optical fiber array component 42, the photonic component 40, the connection element 940, the RDL 72, the pillar 52, the RDL 70, the component 32 (e.g., including one or more TIA units), the RDL 70, the component (e.g., including one or more DSP units), the RDL 70, the pillar 62, the component 20 (e.g., the processing component), the pillar 62, the RDL 70, the component 30, the RDL 70, the component 32 (e.g., including one or more DRV units), the RDL 70, the pillar 50, the RDL 72, the connection element 940, the photonic component 40, and the optical fiber array component 42. The photonic component 40 may convert an optical signal to an electrical signal and transmit the electrical signal to the component 32 (e.g., TIA) through the signal path E1. An electrical signal may be transmitted from the component 32 to the component 30 (e.g., DSP) through the signal path E1, and an electrical signal may be transmitted between the component 30 and the component 32 through the signal path E1. An electrical signal may be transmitted from the component 32 (e.g., DRV) to the photonic component 40 through the signal path E1.

In some cases wherein an ASIC is arranged with EICs in a side-by-side fashion, the ASIC and the EICs are electrically connected to each other through a substrate or an interposer disposed underneath. The transmission path between the EICs and the ASIC may be relatively long, the relatively long transmission path may increase the possibility of distortion of signals, and the device area is relatively large. In contrast, according to some embodiments of the present disclosure, with the design of the vertical electrical connection between the component 20 and the components 30 and 32 stacked over the component 20, the transmission path is significantly reduced, thereby the resistance of the transmission path is significantly reduced, and thus the electrical performance of the optical device 1 can be improved. In addition, the device area in horizontal direction (e.g., x-y plane) can be reduced as well.

In addition, according to some embodiments of the present disclosure, with the design of the active surface 301 of the component 30 bonded to the active surface 201 of the component 20, due to the reduced distance between the active surface 301 of the component 30 (e.g., DSP) and the active surface 201 of the component 20 (e.g., ASIC), the pitch of the electrical connection structure (e.g., the RDL 70 and/or the pillars 62) therebetween can be reduced significantly. As such, the number of connection terminals or ports can be increased, individual signals can be transmitted through respective terminals or ports (also referred to as "a parallel interface"), instead of multiple signals sharing the same terminal or port (also referred to as "a serial electrical interface"). Therefore, additional electrical connection element (e.g., a SERDES device) is not required for assisting the electrical connection between the component 20 and the component 30, and the manufacturing cost can be reduced as well.

In addition, according to some embodiments of the present disclosure, with the design of the adhesive layer 91 including a TIM and between the component 20 and the electrical contacts 930, heat may be dissipated from the component 20 towards the carrier 10 more efficiently. Moreover, according to some embodiments of the present disclosure, with the design of the dummy conductive portions of the RDL 74 directly under the adhesive layer 91, heat dissipation effect may be further improved.

Moreover, in some cases where a plurality of optical engines each including at least a TIA, a DRV, a DSP, and a PIC are arranged around multiple sides of an ASIC, the transmission paths may be relatively long, and each optical engine requires a die attach operation to be connected to the ASIC. In contrast, according to some embodiments of the present disclosure, with the design of integrating a plurality of DSP units into the component 30, integrating a plurality of electro-optical units (e.g., TIA units and/or DRV units) into the component 32, and integrating a plurality of photonic units into the photonic component 40, the number of components 30 and 32 and the photonic component 40 can be reduced, and thus the number of the electrical connection structures as well as die attach operations can be reduced, so as to simplify the structure as well as the manufacturing process of the optical device 1. For example, a plurality of DSP units can be integrated into one component 30 which can be stacked over the component 20, thus the transmission path can be reduced as mentioned above, the number of components in the optical device 1 can be reduced, and the costs can be reduced. Besides, with the number of the photonic component 40 being reduced, the number of FAUs can be reduced, and thus the number of the waveguide can be reduced, so as to further simplify the structure as well as the manufacturing process of the optical device 1.

In some embodiments, a wafer node of EICs is less than about 16 nm, and a wafer node of PICs is about 45 nm or 90 nm. According to some embodiments of the present disclosure, with the design of the components 20, 30, and 32 including integrated EIC units and the photonic component 40 including integrated PIC units, the components 20, 30, and 32 and the photonic component 40 are manufactured separately prior to being bonded into the optical device 1. For example, the photonic component 40 having a relatively large wafer node and the component 30 having a relatively small wafer node can be manufactured separately prior to being bonded to each other. Therefore, the flexibility of the manufacturing process is increased, and the yield can be increased as well.

Figure 2:
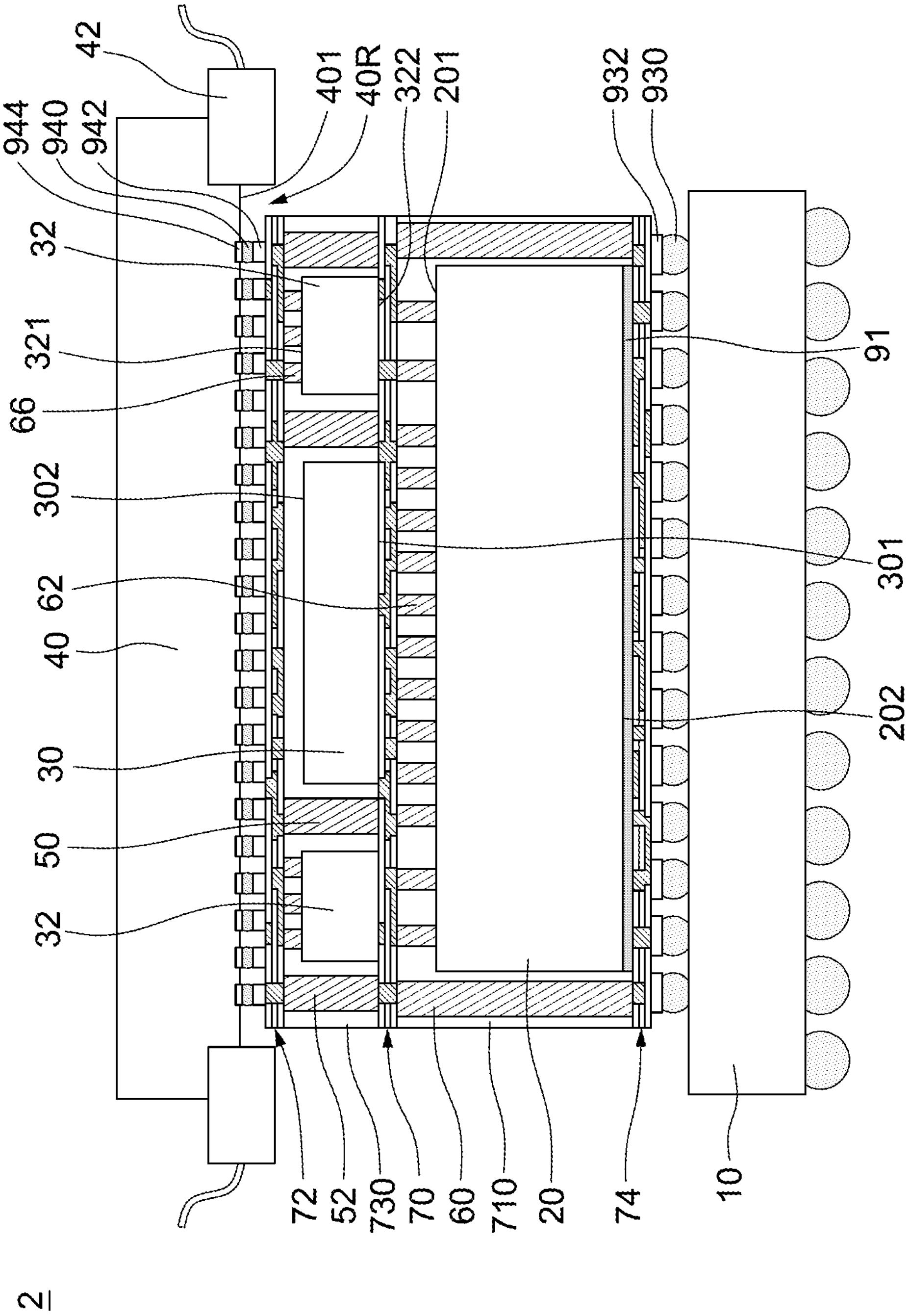
FIG. 2 illustrates a cross-sectional view of an optical device in accordance with some embodiments of the present disclosure.

FIG. 2 illustrates a cross-sectional view of an optical device 2 in accordance with some embodiments of the present disclosure. The optical device 2 is similar to the optical device 1 in FIG. 1, and the differences therebetween are described as follows.

In some embodiments, the active surface 321 of the component 32 is electrically connected to the RDL 72. In some embodiments, the active surface 321 of the component 32 is electrically connected to the RDL 72 through pillars 66. The pillars 66 may be conductive pillars or electrically conductive pillars. In some embodiments, the pillars 66 are covered or encapsulated by the encapsulant 730.

According to some embodiments of the present disclosure, the active surface 301 is directly electrically connected to the RDL 70, and the active surface 321 is directly electrically connected to the RDL 70, e.g., through the pillars 62. Therefore, an electrical transmission path between the component 30 and the component 32 can be reduced, and thus the transmission speed can be increased.

Figure 3:
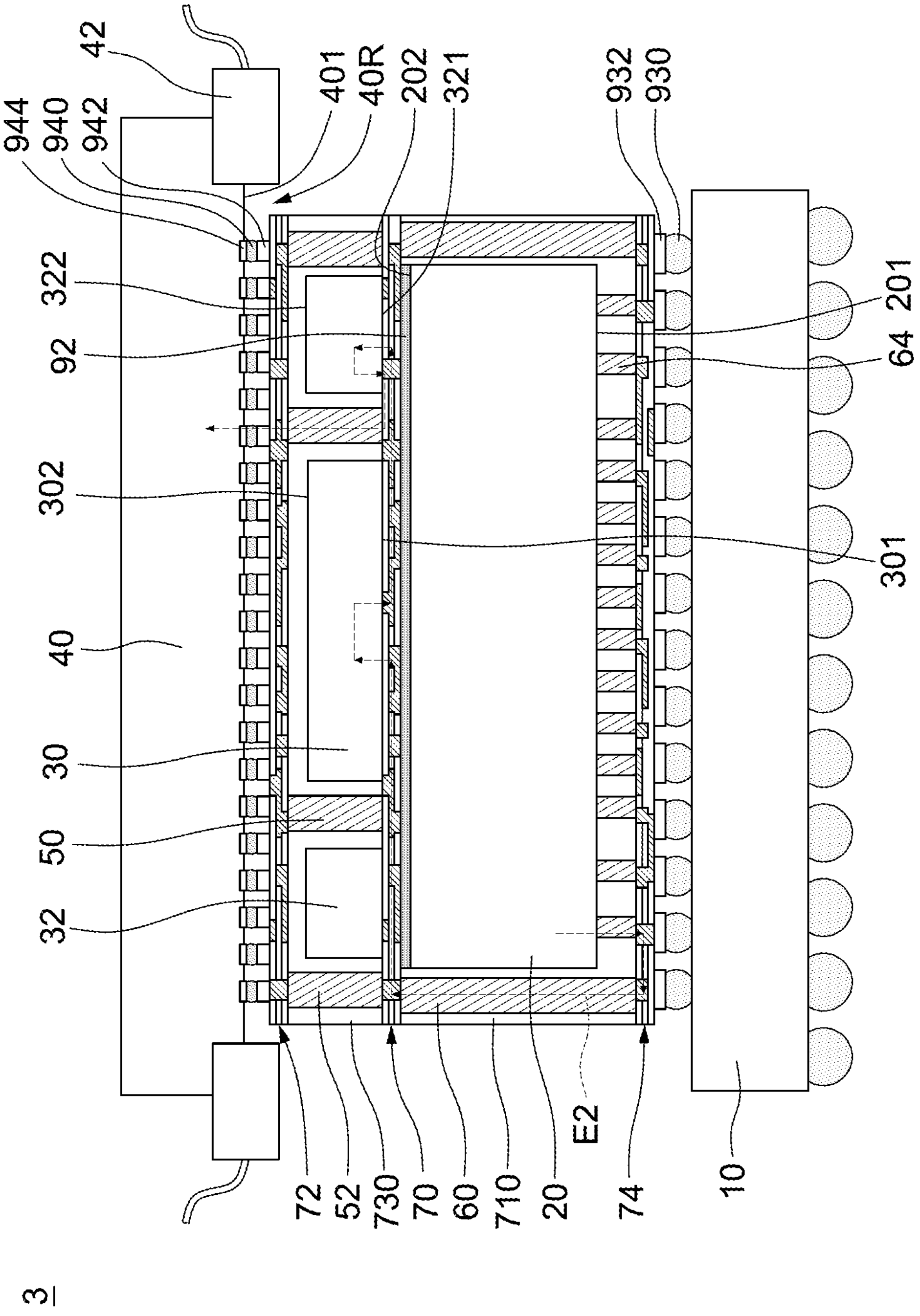
FIG. 3 illustrates a cross-sectional view of an optical device in accordance with some embodiments of the present disclosure.

FIG. 3 illustrates a cross-sectional view of an optical device 3 in accordance with some embodiments of the present disclosure. The optical device 3 is similar to the optical device 1 in FIG. 1, and the differences therebetween are described as follows.

In some embodiments, the active surface 201 of the component 20 is electrically connected to the RDL 74. In some embodiments, the active surface 201 of the component 20 is electrically connected to the RDL 74 through pillars 64. The pillars 64 may be conductive pillars or electrically conductive pillars. In some embodiments, the pillars 64 are covered or encapsulated by the encapsulant 710.

In some embodiments, the pillars 64 are between the component 20 and the RDL 74 and configured to provide a signal path E2. In some embodiments, the signal path E2 passes through the component 20, the pillar 64, the RDL 74, the pillar 60, the RDL 70, the component 30 (e.g., DSP), the RDL 70, the component 32 (e.g., DRV), the RDL 70, and the pillar 50. The photonic component 40 may convert an optical signal to an electrical signal and transmit the electrical signal to the component 32 (e.g., TIA) through a portion of the signal path E1 (not shown in FIG. 3, please refer to FIG. 1). The portion of the signal path E1 may pass through the optical fiber array component 42, the photonic component 40, the connection element 940, the RDL 72, the pillar 52, the RDL 70, and the component 32, as illustrated in FIG. 1. An electrical signal may be transmitted from the component 32 to the component 30 (e.g., DSP) through a portion of the signal path E1 which may pass through the RDL 70 (e.g., the second part of the RDL 70). An electrical signal may be transmitted between the component 20 and the component 30 through a portion of the signal path E2 which passes through the RDL 70 (e.g., the second part of the RDL the pillar 60, the RDL 74, and the pillar 64. An electrical signal may be transmitted between the component 20 and the photonic component 40 through the signal path E2. In some embodiments, the component 20 may dissipate heat towards the carrier 10 through the pillars 64.

According to some embodiments of the present disclosure, with the design of the active surface 201 of the component 20 being electrically connected to the carrier 10 through the pillars 64 and the RDL 74, the heat dissipation from the component 20 the carrier 10 can be further improved.

Figure 4:
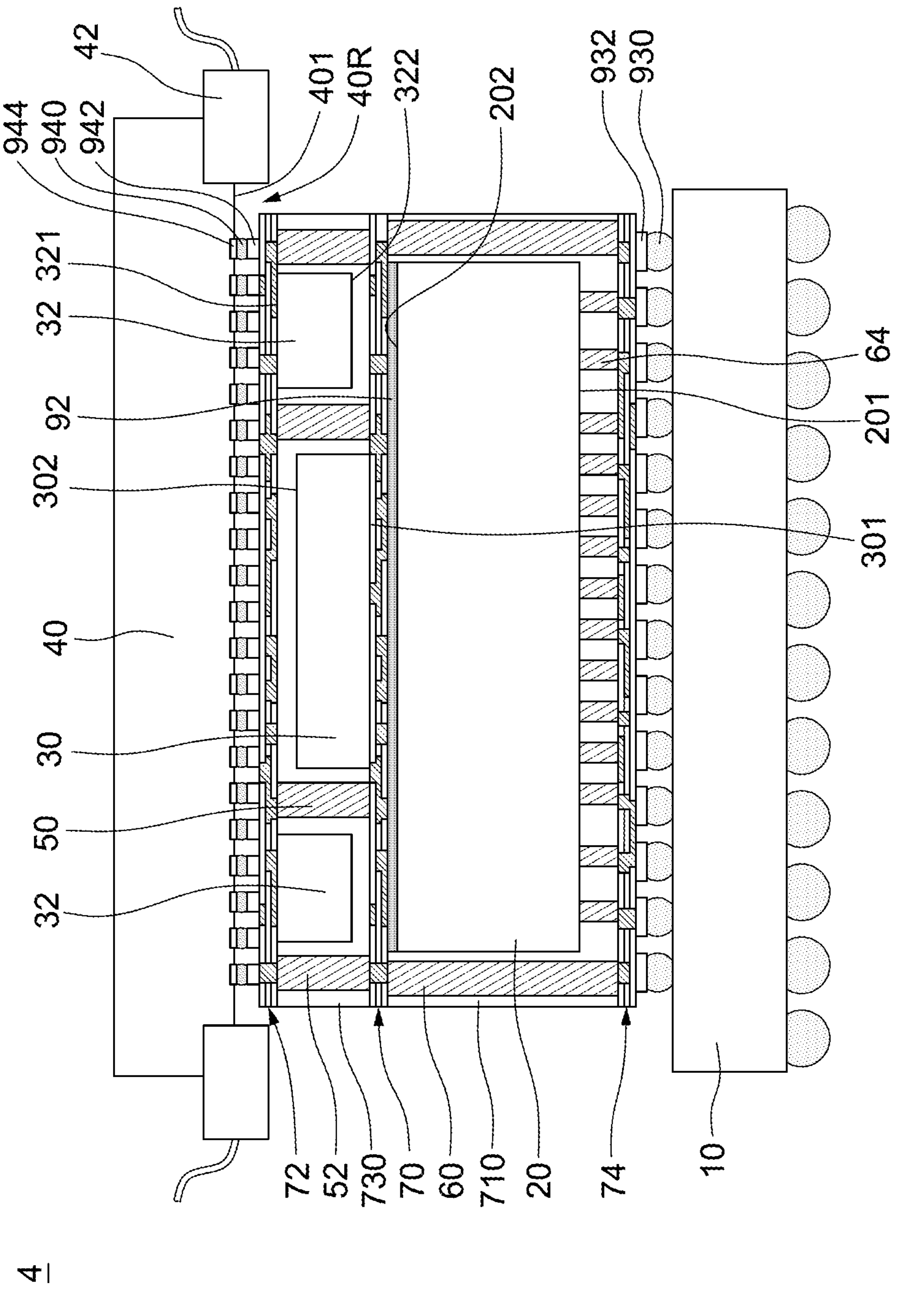
FIG. 4 illustrates a cross-sectional view of an optical device in accordance with some embodiments of the present disclosure.

FIG. 4 illustrates a cross-sectional view of an optical device 4 in accordance with some embodiments of the present disclosure. The optical device 4 is similar to the optical device 3 in FIG. 3, and the differences therebetween are described as follows.

In some embodiments, the active surface 321 of the component 32 is electrically connected to the RDL 72. In some embodiments, the backside surface 322 of the component 32 is spaced apart from the RDL 70. According to some embodiments of the present disclosure, with the design of the active surface 201 of the component 20 being electrically connected to the carrier through the pillars 64 and the RDL 74, the heat dissipation from the component 20 the carrier can be further improved.

Figure 5A:
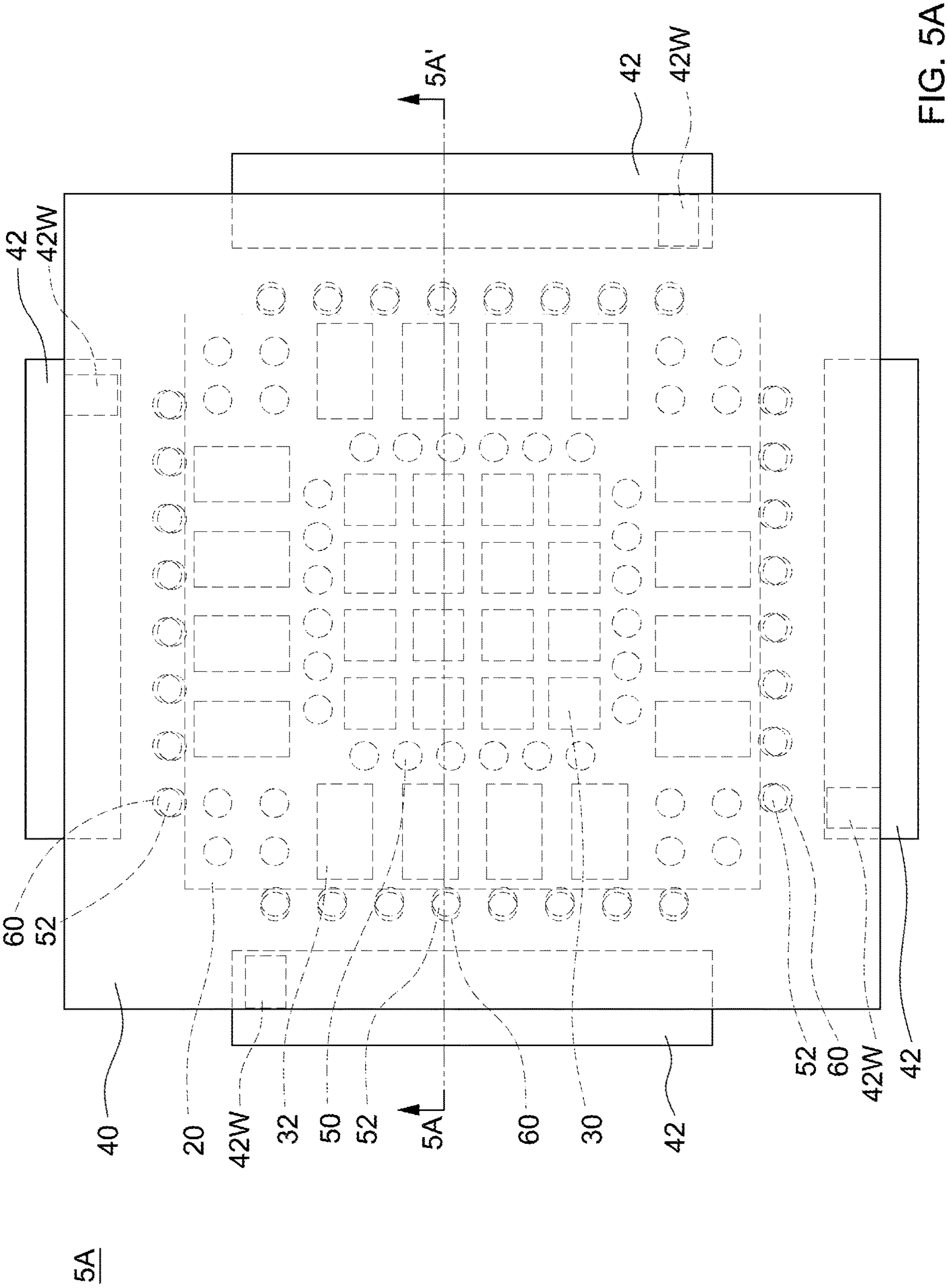
FIG. 5A illustrates a top view of an optical device in accordance with some embodiments of the present disclosure.

FIG. 5A illustrates a top view of an optical device 5A in accordance with some embodiments of the present disclosure. In some embodiments, a cross-sectional view of the optical device 5A along the cross-sectional line 5A-5A' may show a cross-sectional structure as illustrated in any one of the structures in FIGS. 1-4. The optical device 5A is similar to the optical device 1 in FIG. 1, and the differences therebetween are described as follows.

In some embodiments, the optical device 5A includes a plurality of components 30 and a plurality of components 32. In some embodiments, each of the components 32 includes a set of one TIA unit and one DRV unit, and each of the components 30 includes a DSP unit. In some embodiments, each of the DSP units (or the component 30) may be corresponding to one component 32. In some embodiments, the components 30 and the components 32 are located within a projection of the component 20 from a top view perspective. In some embodiments, each of the optical fiber components 42 includes integrated FAUs and a waveguide 42W.

Figure 5B:
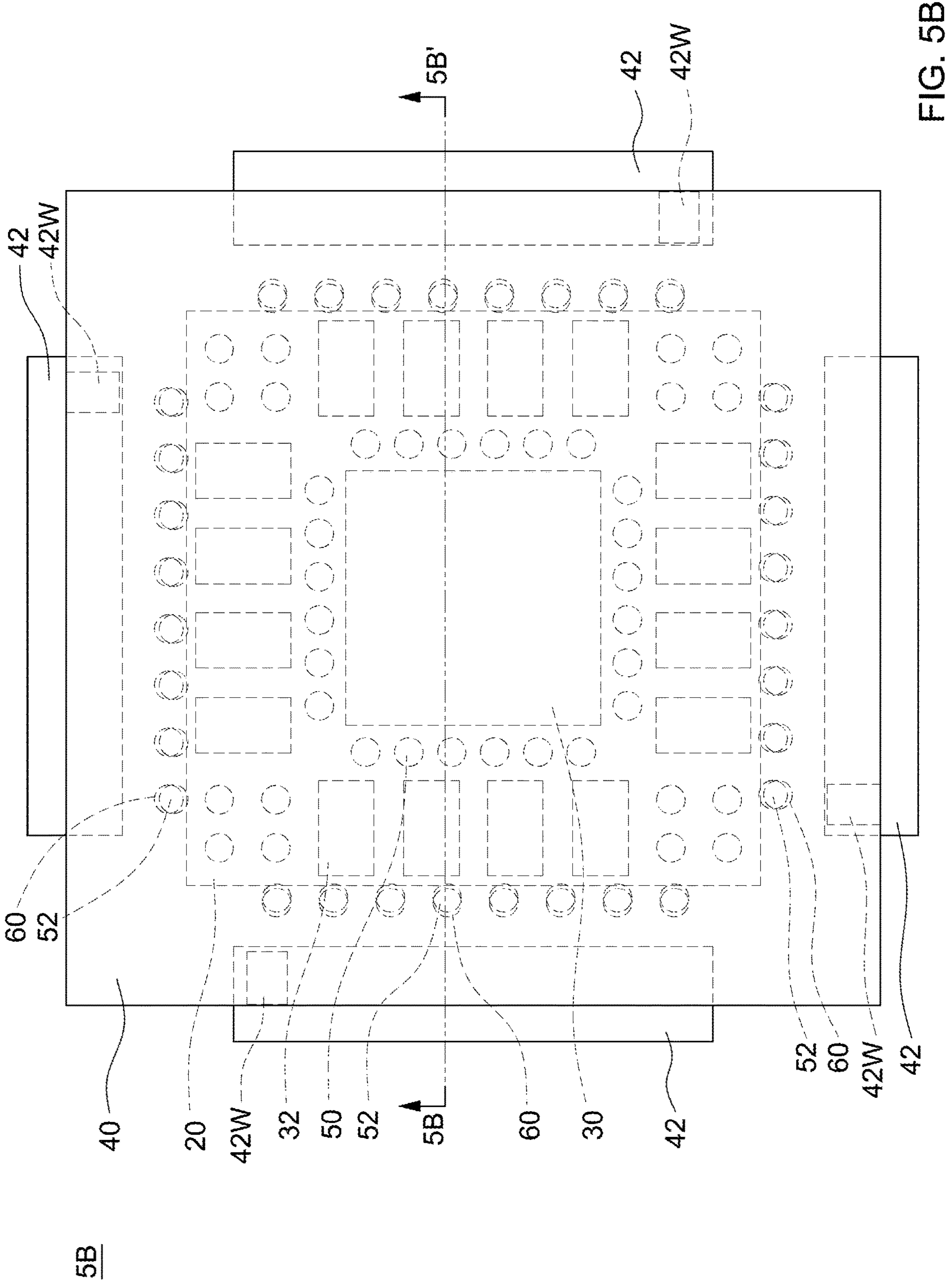
FIG. 5B illustrates a top view of an optical device in accordance with some embodiments of the present disclosure.

FIG. 5B illustrates a top view of an optical device 5B in accordance with some embodiments of the present disclosure. In some embodiments, a cross-sectional view of the optical device 5B along the cross-sectional line 5B-5B' may show a cross-sectional structure as illustrated in any one of the structures in FIGS. 1-4. The optical device 5B is similar to the optical device 5A in FIG. 5A, and the differences therebetween are described as follows.

In some embodiments, each of the components 32 includes a set of one TIA unit and one DRV unit, and the component 30 includes integrated DSP units. In some embodiments, the component 30 and the components 32 are located within a projection of the component 20 from a top view perspective. In some embodiments, each of the optical fiber components 42 includes integrated FAUs and a waveguide 42W.

Figure 5C:
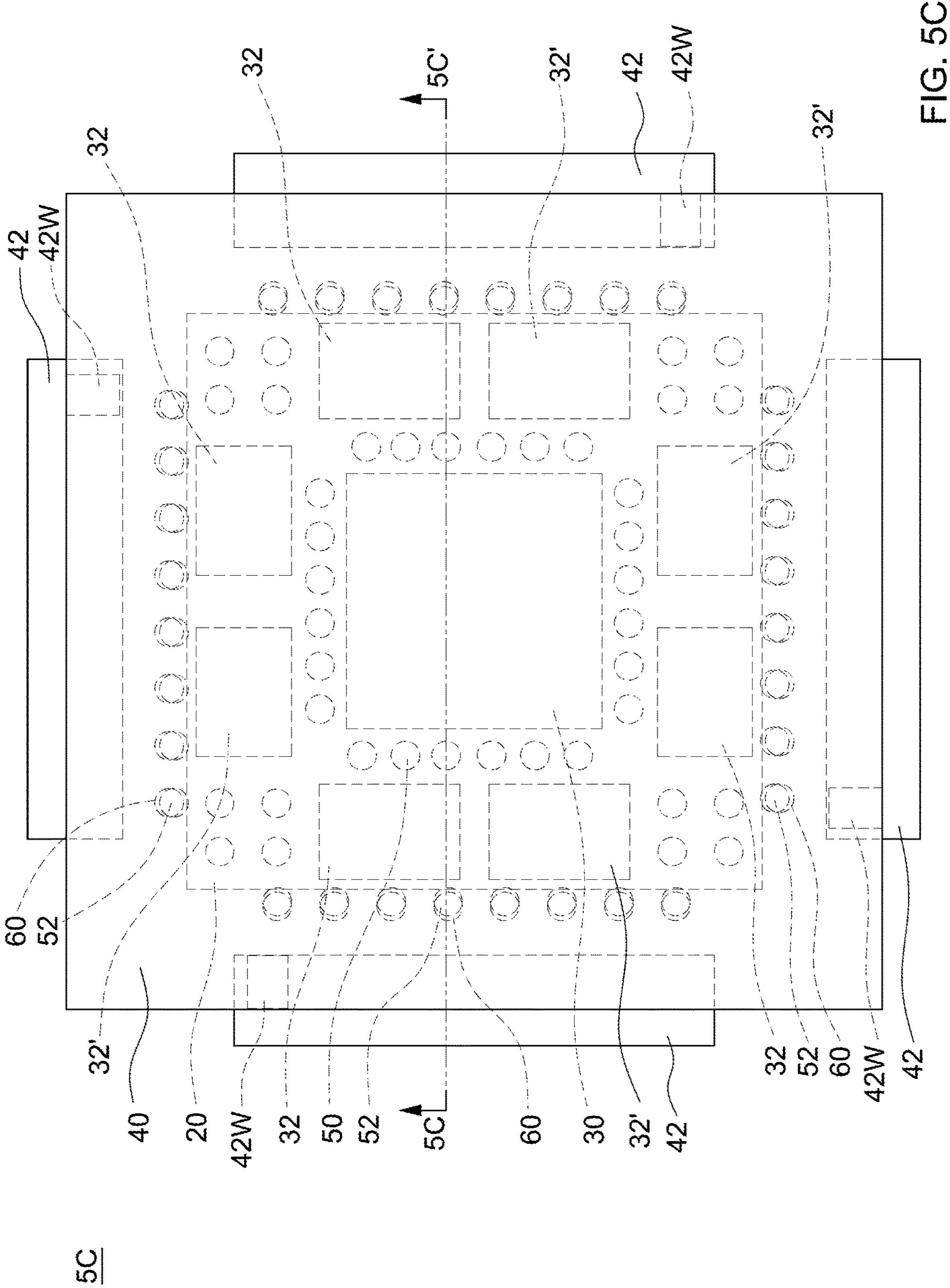
FIG. 5C illustrates a top view of an optical device in accordance with some embodiments of the present disclosure.

FIG. 5C illustrates a top view of an optical device 5C in accordance with some embodiments of the present disclosure. In some embodiments, a cross-sectional view of the optical device 5C along the cross-sectional line 5C-5C' may show a cross-sectional structure as illustrated in any one of the structures in FIGS. 1-4. The optical device 5C is similar to the optical device 5A in FIG. 5A, and the differences therebetween are described as follows.

In some embodiments, the optical device 5C includes a plurality of components 32 and 32'. In some embodiments, the components 32 and 32' include a plurality of electro-optical chiplets. In some embodiments, each of the components 32 includes integrated DRV units, and each of the components 32' includes integrated TIA units. In some other embodiments, each of the components 32 and 32' includes a plurality sets of TIA units and DRV units. In some embodiments, the component 30 includes integrated DSP units. In some embodiments, each of the optical fiber components 42 includes integrated fiber array units (FAUs) and a waveguide 42W.

In some embodiments, the component 30 and the components 32 and 32' are located within a projection of the component 20 from a top view perspective. The device area in horizontal direction (e.g., x-y plane) can be reduced.

Figure 5D:
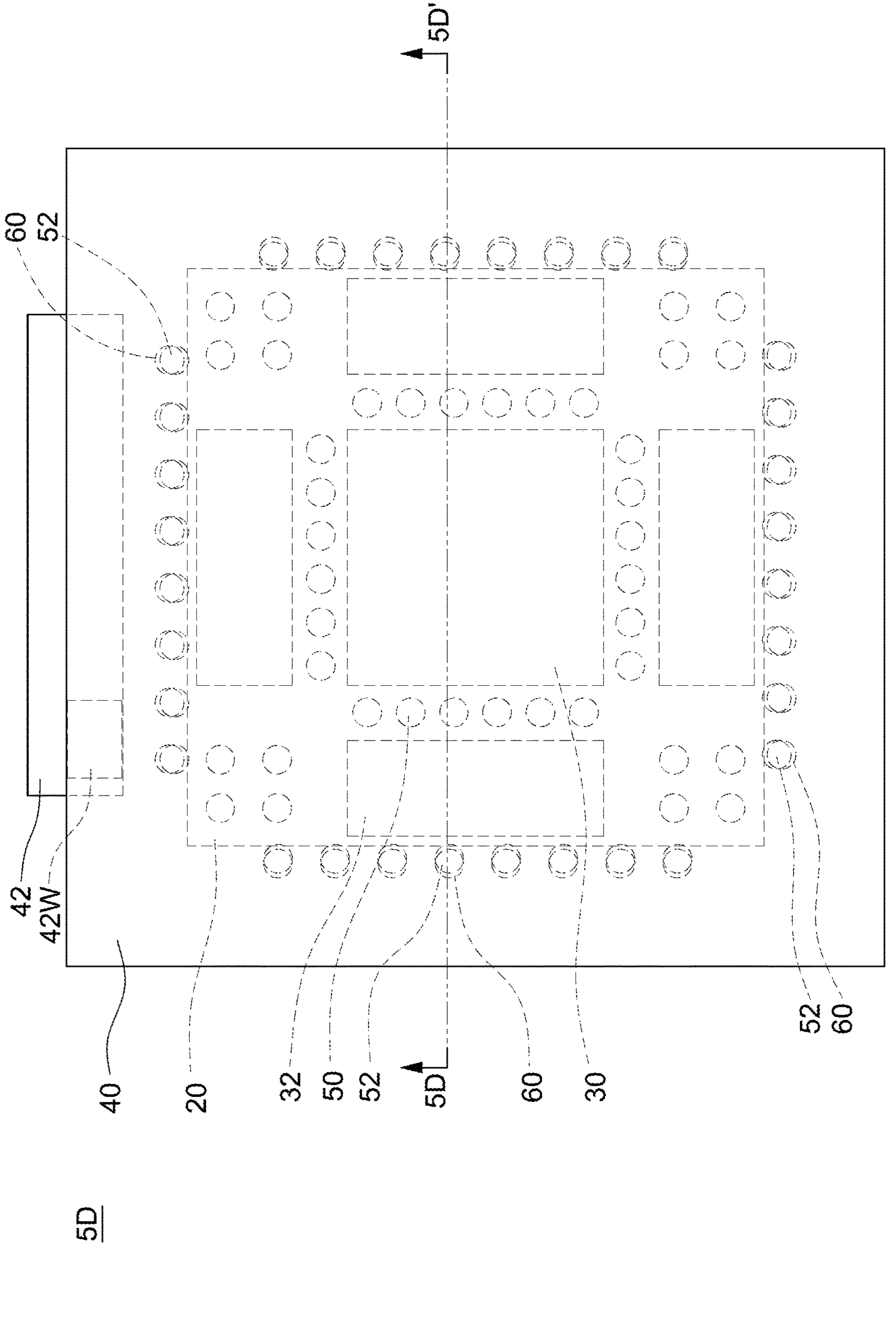
FIG. 5D illustrates a top view of an optical device in accordance with some embodiments of the present disclosure.

FIG. 5D illustrates a top view of an optical device 5D in accordance with some embodiments of the present disclosure. In some embodiments, a cross-sectional view of the optical device 5D along the cross-sectional line 5D-5D' may show a cross-sectional structure as illustrated in any one of the structures in FIGS. 1-4. The optical device 5D is similar to the optical device 5A in FIG. 5A, and the differences therebetween are described as follows.

In some embodiments, the optical device 5D includes a component 30, a plurality of components 32, and an optical fiber component 42. In some embodiments, each of the sides of the component 30 is arranged with one component 32. In some embodiments, each of the components 32 includes a plurality sets of TIA units and DRV units. In some embodiments, the component 30 includes integrated DSP units. In some embodiments, the optical fiber component 42 includes integrated FAUs and a waveguide 42W.

According to some embodiments of the present disclosure, with the design of integrating a plurality of FAUs into the optical fiber component 42, the number of separate FAUs can be reduced, and thus the number of the waveguide 42W can be reduced, so as to simplify the manufacturing process of the optical device 5C.

Figure 6:
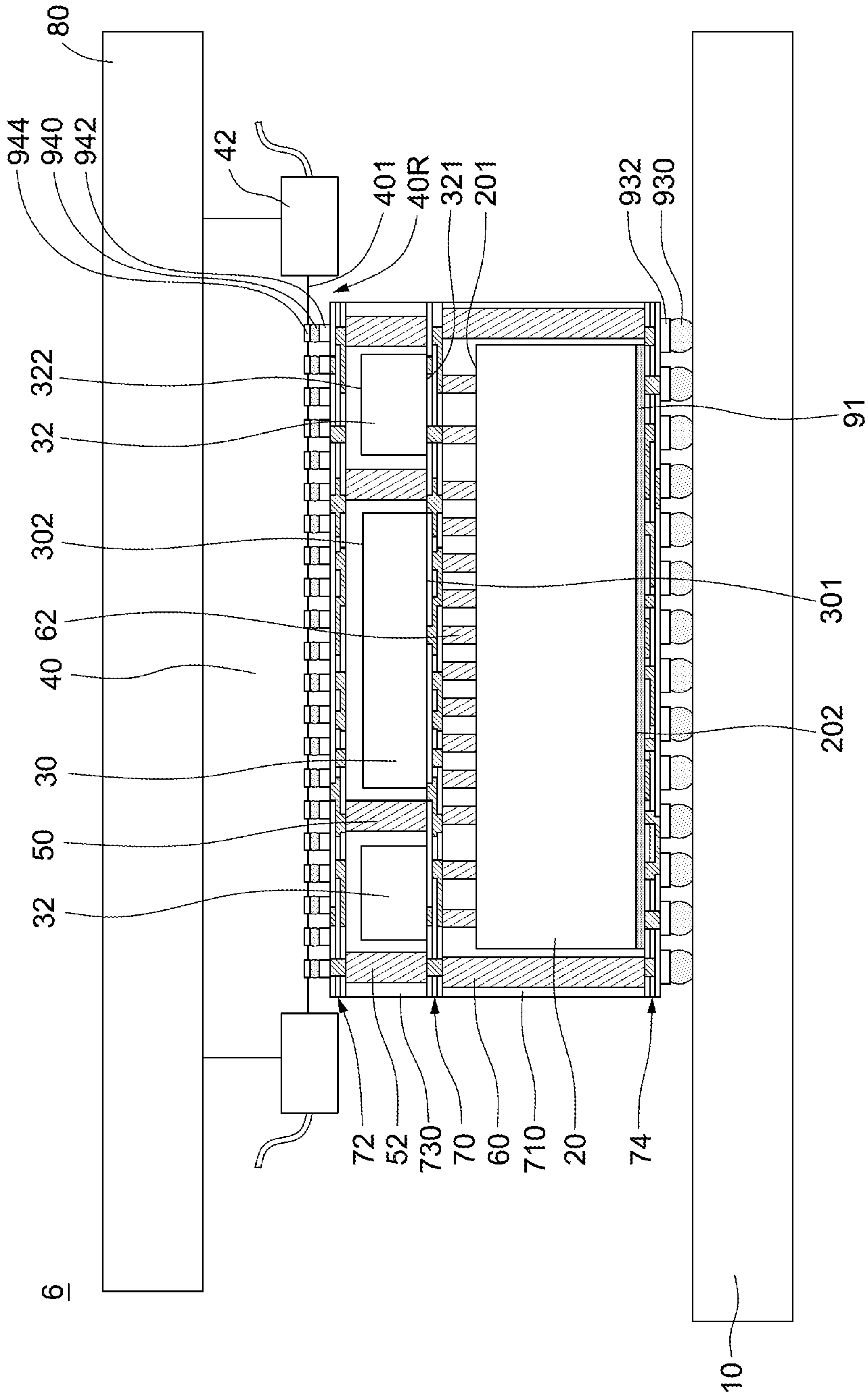
FIG. 6 illustrates a cross-sectional view of an optical device in accordance with some embodiments of the present disclosure.

FIG. 6 illustrates a cross-sectional view of an optical device 6 in accordance with some embodiments of the present disclosure. The optical device 6 is similar to the optical device 1 in FIG. 1, and the differences therebetween are described as follows.

In some embodiments, the optical device 6 further includes a heat dissipation structure disposed over the photonic component 40. In some embodiments, the heat dissipation structure is configured to reduce a heat accumulation in the component 20. In some embodiments, the photonic component 40 dissipates heat along a first direction towards the heat dissipation structure in a first rate and dissipates heat along a second direction opposite to the first direction in a second rate less than the first rate. In some embodiments, a heat resistance of the heat from the photonic component 40 towards the heat dissipation structure 80 is less than a heat resistance of the heat from the photonic component 40 towards a direction opposite to the heat dissipation structure 80 (e.g., towards the carrier 10). In some embodiments, a heat dissipation path from the photonic component 40 towards the heat dissipation structure 80 is less than a heat dissipation path from the photonic component 40 towards the carrier 10. In some embodiments, a thermal conductivity of one or more materials passed by the heat dissipation path from the photonic component 40 towards the heat dissipation structure 80 is higher than a thermal conductivity of one or more materials passed by the heat dissipation path from the photonic component 40 towards the carrier 10. In some embodiments, the component 20 dissipates heat towards a direction opposite to the heat dissipation structure 80. In some embodiments, the component 20 dissipates heat towards the carrier 10.

According to some embodiments of the present disclosure, while heat may be easily accumulated within the stacked structure of the optical device 6, with the design of dissipating heats of the photonic component 40 and the component 20 towards different directions, heat dissipation of the optical device 6 may be further improved, and thereby the temperature of the optical device 6 can be reduced.

In addition, in some cases where an optical device does not include a heat dissipation structure, all of the heat generated by the processing component, the electronic components, and the photonic component is dissipated towards a carrier, and thus heat may be easily accumulated within the optical device. In contrast, according to some embodiments of the present disclosure, with the arrangement of the heat dissipation structure 80, the photonic component 40 may dissipate heat along a direction towards the heat dissipation structure 80 at a higher rate, through a shorter heat dissipation path, and/or through one or more materials that have a higher thermal conductivity than along a direction opposite to the direction towards to the heat dissipation structure 80. Therefore, heat dissipation of the optical device 6 may be further improved, for example, about 66% of the heat generated within the optical device 6 may be dissipated towards the heat dissipation structure 80, and thereby the temperature of the optical device 6 can be further reduced.

Figure 7A:
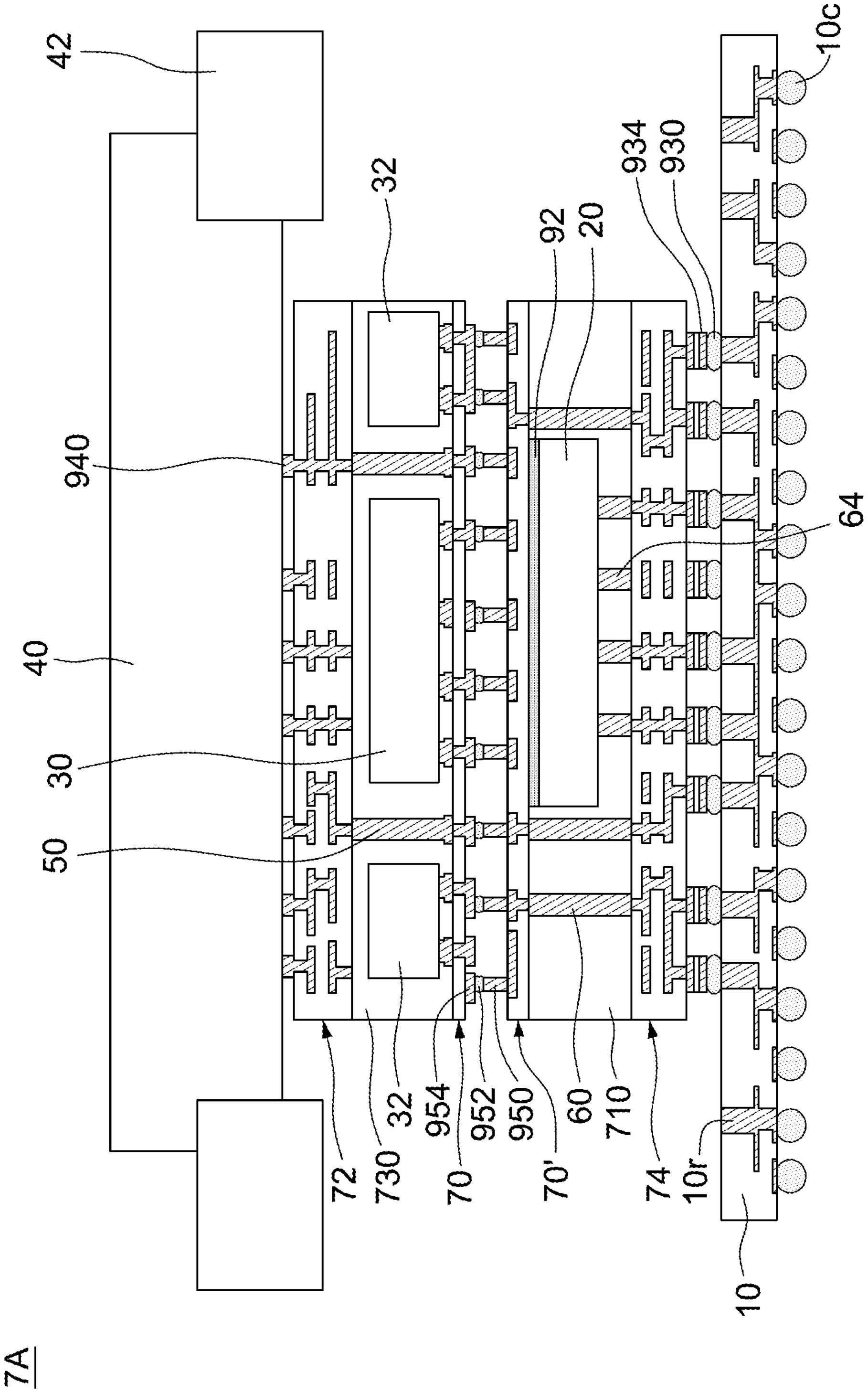
FIG. 7A illustrates a cross-sectional view of an optical device in accordance with some embodiments of the present disclosure.

FIG. 7A illustrates a cross-sectional view of an optical device 7A in accordance with some embodiments of the present disclosure. The optical device 7A is similar to the optical device 3 in FIG. 3, and the differences therebetween are described as follows.

In some embodiments, the optical device 7A includes RDLs 70 and 70' between the encapsulant 710 and the encapsulant 730. The RDL 70 is electrically connected to the RDL 70' through a bump joint structure. The bump joint structure may include a plurality of conductive pillars 950, a plurality of conductive bumps 952, and a plurality of conductive pads 954.

In some embodiments, carrier 10 includes an interconnection structure 10*r* (or an RDL). In some embodiments, the RDL 74 is electrically connected to the carrier 10 through the electrical contacts 930 and conductive pads 934. Each of the conductive pads 934 may include a multi-layered structure including, for example, a conductive layer, a seed layer, and/or the like. In some embodiments, the optical device 7A further includes a plurality of electrical contacts 10*c* disposed under the carrier 10. The electrical contacts 10*c* may include controlled collapse chip connection (C4) bumps, a ball grid array (BGA) or a land grid array (LGA).

Figure 7B:
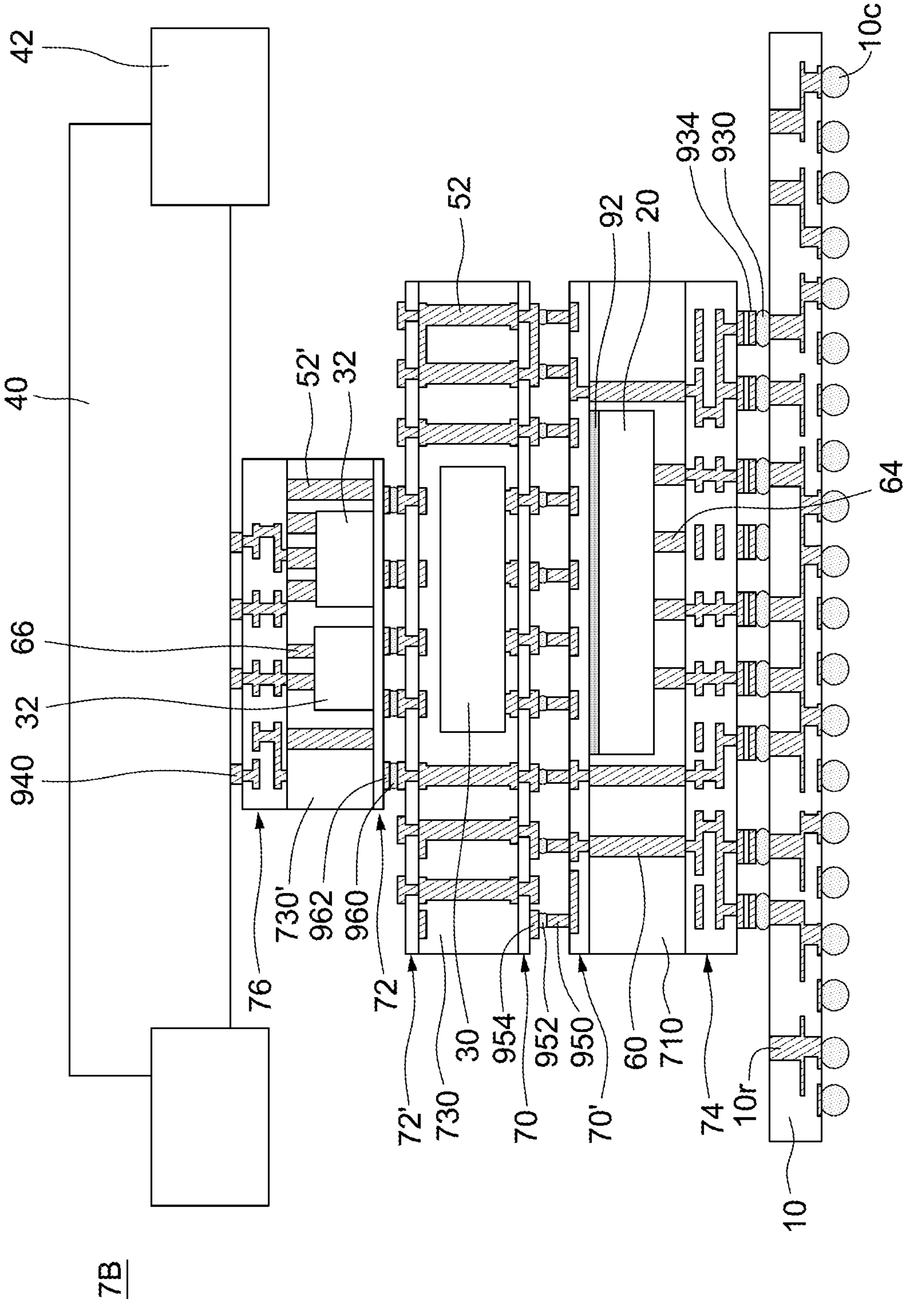
FIG. 7B illustrates a cross-sectional view of an optical device in accordance with some embodiments of the present disclosure.

FIG. 7B illustrates a cross-sectional view of an optical device 7B in accordance with some embodiments of the present disclosure. The optical device 7B is similar to the optical device 7A in FIG. 7A, and the differences therebetween are described as follows.

In some embodiments, the optical device 7B further includes pillars 52', RDLs 72' and 76, an encapsulant 730', and connection elements 960 and 962. In some embodiments, the RDL 76 is over the RDL 72', the RDL 72' is over the RDL 72, and the encapsulant 730' is over the encapsulant 730. In some embodiments, the encapsulant 730 covers or encapsulates the component 30 and the pillars 52. In some embodiments, the encapsulant 730' covers or encapsulates the components 32 and the pillars 52' and 66.

In some embodiments, the RDLs 72 and 72' are between the encapsulant 730 and the encapsulant 730'. In some embodiments, the RDL 72 is electrically connected to the RDL 72' through the connection elements 960 and 962. The connection elements 960 may include conductive bumps, and the connection elements 962 may include conductive pads. In some embodiments, the photonic component 40 is electrically connected to the RDL 76 through the connection elements 940. According to some embodiments of the present disclosure, with the design of stacking the components 32 over the component 30, the size of the optical device 7B in a horizontal direction may be reduced.

FIG. 8A, FIG. 8B, FIG. 8C, FIG. 8D, and FIG. 8E illustrate various operations in a method of manufacturing an optical device 1A in accordance with some embodiments of the present disclosure.

Figure 8A:
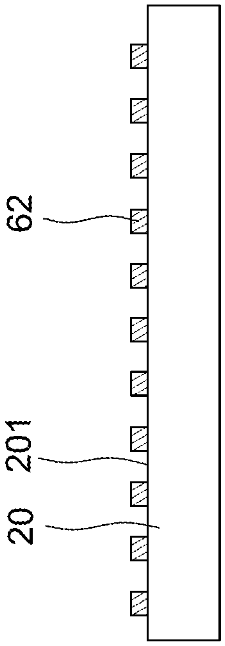
FIG. 8A, FIG. 8B, FIG. 8C, FIG. 8D, and FIG. 8E illustrate various operations in a method of manufacturing an optical device in accordance with some embodiments of the present disclosure.

Referring to FIG. 8A, a component 20 may be provided, and pillars 62 may be formed on an active surface 201 of the component 20.

Figure 8B:
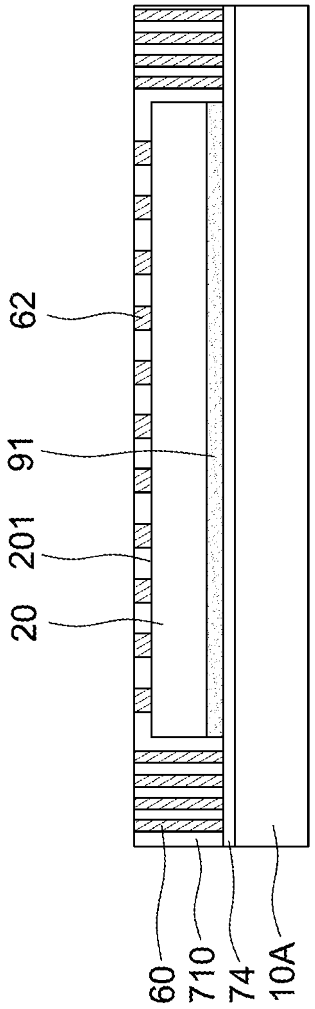

Referring to FIG. 8B, an RDL 74 may be formed on a carrier 10A, the component 20 may be adhered to the RDL 74 through an adhesive layer 91, pillars 60 may be formed on the RDL 74 adjacent to the component 20, and the component 20 and the pillars 60 and 62 may be encapsulated by an encapsulant 710. In some embodiments, a planarization process (e.g., a grinding operation) may be performed to planarized upper surfaces of the encapsulant 710 and the pillars 60 and 62.

Figure 8C:
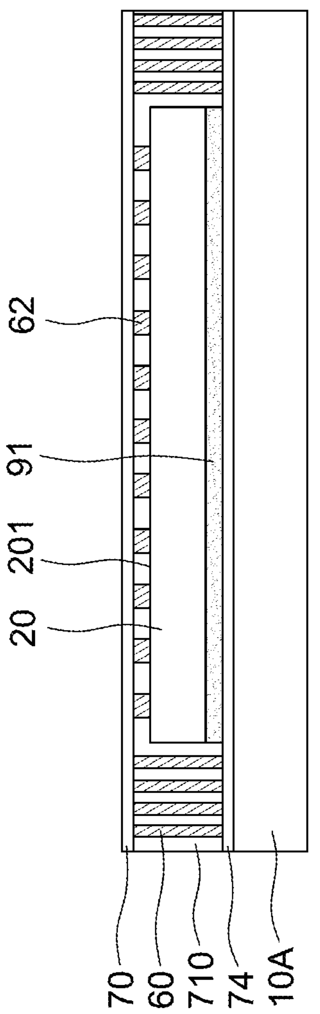

Referring to FIG. 8C, an RDL 70 may be formed on the upper surfaces of the encapsulant 710 and the pillars 60 and 62.

Figure 8D:
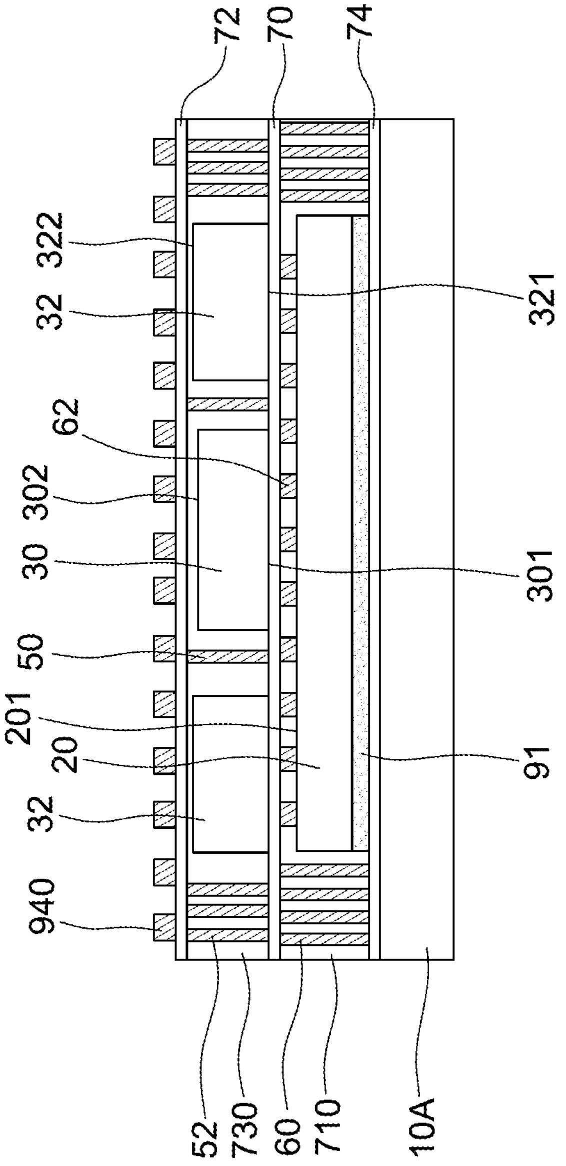

Referring to FIG. 8D, components 30 and 32 may be bonded to the RDL 70, pillars 50 and 52 may be formed on the RDL 70, and the components 30 and 32 and the pillars 50 and 52 may be encapsulated by an encapsulant 730. In some embodiments, an active surface 301 of the component 30 and active surfaces 321 of the components 32 may be flip-chip bonded to the RDL 70. In some embodiments, a planarization process (e.g., a grinding operation) may be performed to planarized upper surfaces of the encapsulant 730 and the pillars 50 and 52.

Still referring to FIG. 8D, an RDL 72 may be formed on the upper surfaces of the encapsulant 730 and the pillars 50 and 52, and connection elements 940 may be formed on the RDL 72.

Figure 8E:
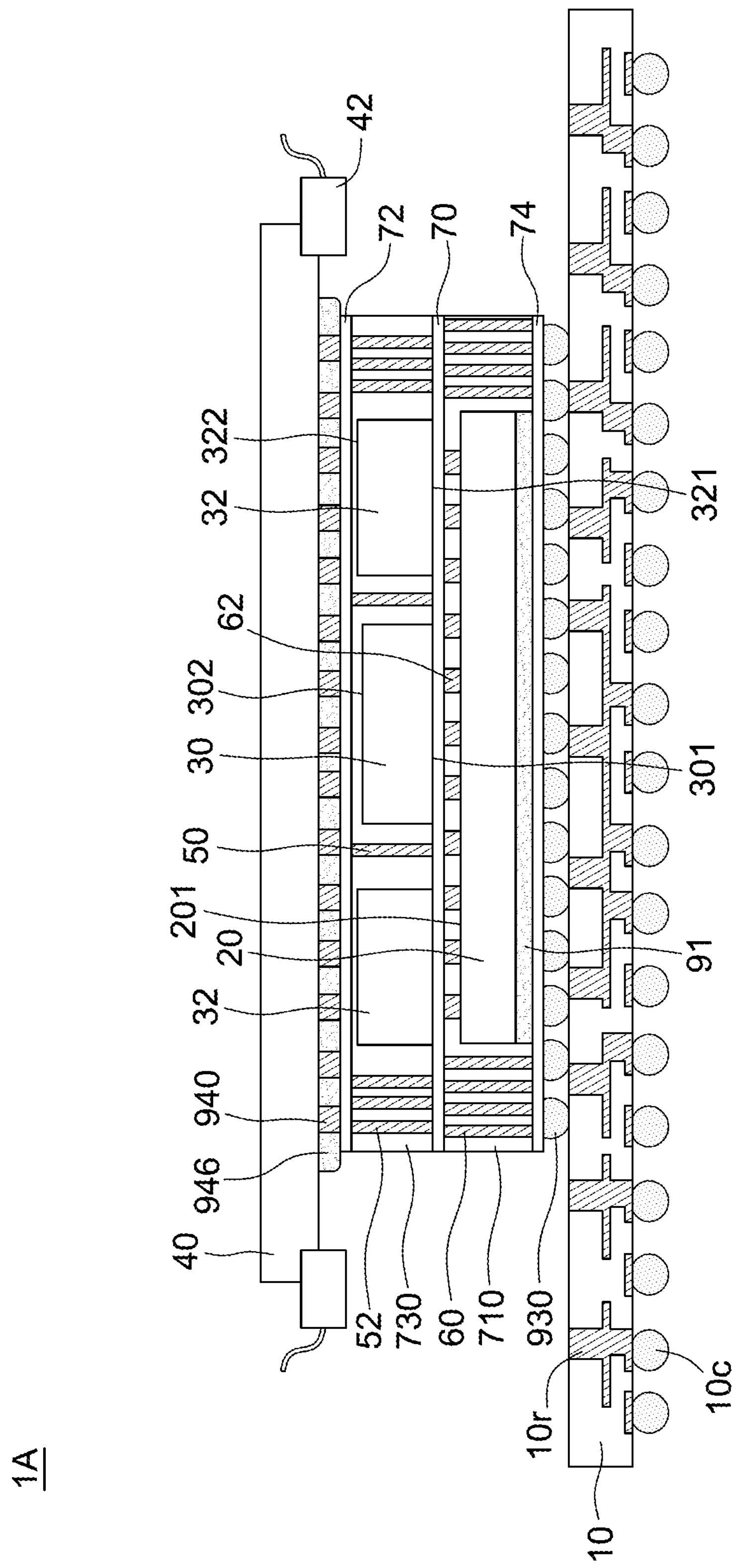

Referring to FIG. 8E, a photonic component 40 with optical fiber array components 42 may be bonded to the RDL 72 through the connection elements 940, an underfill 946 may be formed to cover the connection elements 940, the carrier 10A (shown in FIG. 8A) may be removed, and the as-formed structure may be bonded to a carrier 10 through electrical contacts 930. The carrier 10 may include an interconnection structure 10*r* and electrical contacts 10*c*. As such, the optical device 1A is formed.

In some embodiments, referring to FIGS. 1 and 8E, an underfill 946 may not be formed to cover the connection elements 940. In some embodiments, referring to FIGS. 1 and 8E, conductive pads 942 may be further formed to have surfaces substantially coplanar with a surface of the RDL 72, and conductive pads 944 may be further formed to have surfaces substantially coplanar with a surface of the photonic component 40. As such, the optical device 1 illustrated in FIG. 1 is formed.

FIG. 9A, FIG. 9B, FIG. 9C, FIG. 9D, and FIG. 9E illustrate various operations in a method of manufacturing an optical device 3A in accordance with some embodiments of the present disclosure.

Figure 9A:
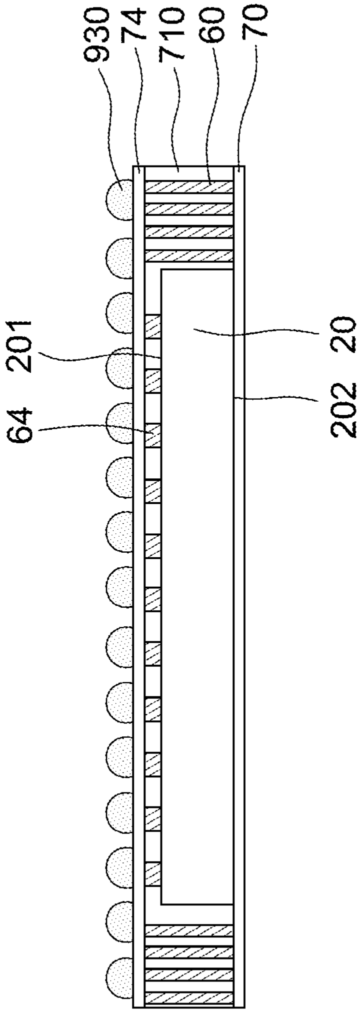
FIG. 9A, FIG. 9B, FIG. 9C, FIG. 9D, and FIG. 9E illustrate various operations in a method of manufacturing an optical device in accordance with some embodiments of the present disclosure.

Referring to FIG. 9A, a component 20 may be provided, pillars 64 may be formed on an active surface 201 of the component 20, an RDL 70 may be formed on a backside surface 202 of the component 20, pillars 60 may be formed on the RDL 70 and adjacent to the component 20, and the component 20 and the pillars 60 and 62 may be encapsulated by an encapsulant 710. In some embodiments, a planarization process (e.g., a grinding operation) may be performed to planarized bottom surfaces of the encapsulant 710 and the pillars 60 and 64. In some embodiments, a carrier (not shown) may be provided, the RDL 70 may be formed on the carrier, and the component 20 and the pillars 60 and 64 may be formed on the RDL 70 supported by the carrier.

Still referring to FIG. 9A, an RDL 74 may be formed on the planarized surfaces of the encapsulant 710 and the pillars 60 and 64, and electrical contacts 930 may be formed on the RDL 74.

Figure 9B:
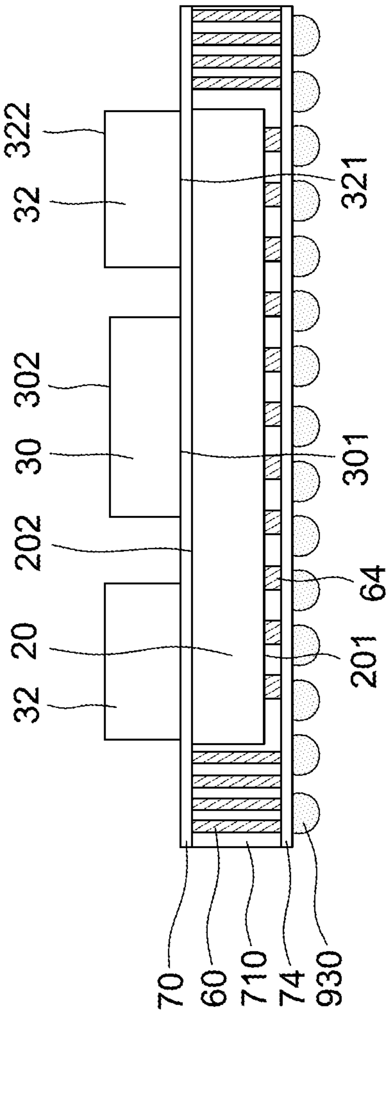

Referring to FIG. 9B, the structure illustrated in FIG. 9A may be flipped, and components 30 and 32 may be bonded to the RDL 70. In some embodiments, an active surface 301 of the component 30 and active surfaces 321 of the components 32 may be flip-chip bonded to the RDL 70.

Figure 9C:
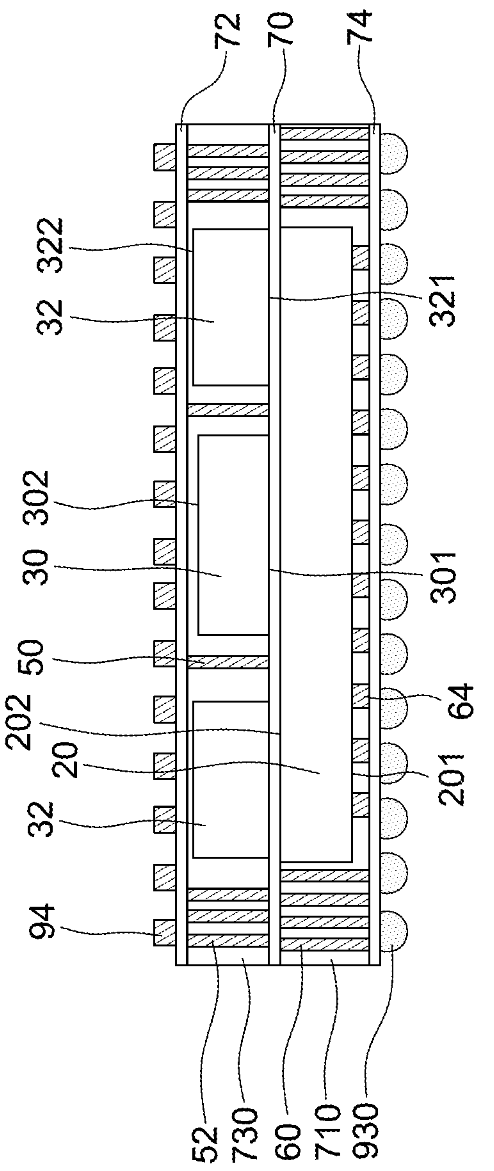

Referring to FIG. 9C, pillars 50 and 52 may be formed on the RDL 70, and the components 30 and 32 and the pillars 50 and 52 may be encapsulated by an encapsulant 730. In some embodiments, a planarization process (e.g., a grinding operation) may be performed to planarized upper surfaces of the encapsulant 730 and the pillars 50 and 52.

Still referring to FIG. 9C, an RDL 72 may be formed on the upper surfaces of the encapsulant 730 and the pillars 50 and 52, and connection elements 940 may be formed on the RDL 72.

Figure 9D:
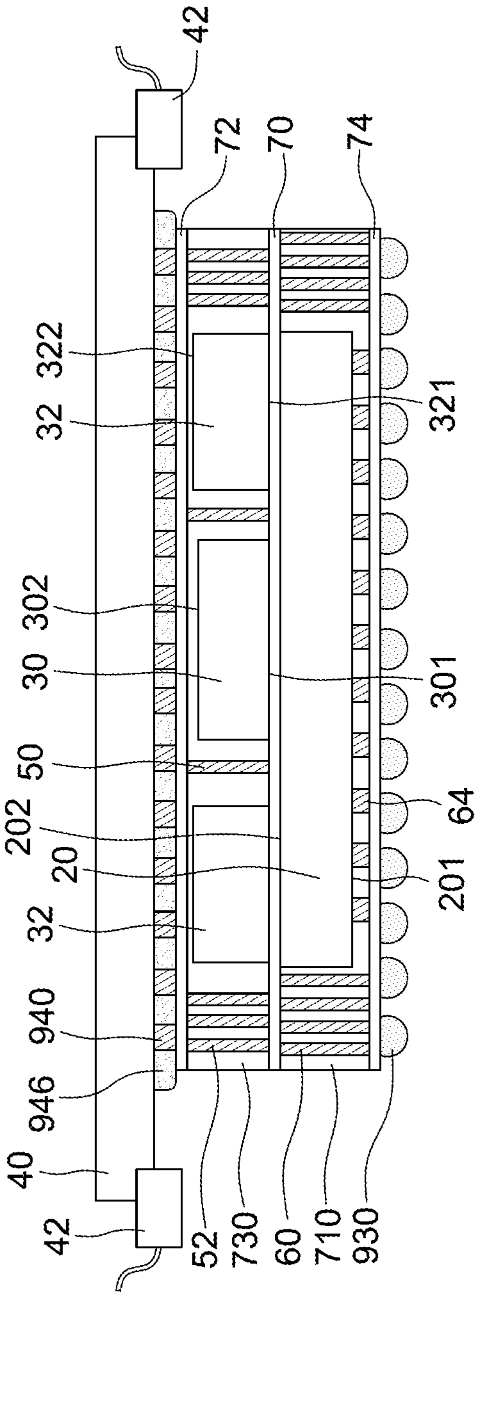

Referring to FIG. 9D, a photonic component 40 with optical fiber array components 42 may be bonded to the RDL 72 through the connection elements 940, and an underfill 946 may be formed to cover the connection elements 940.

Figure 9E:
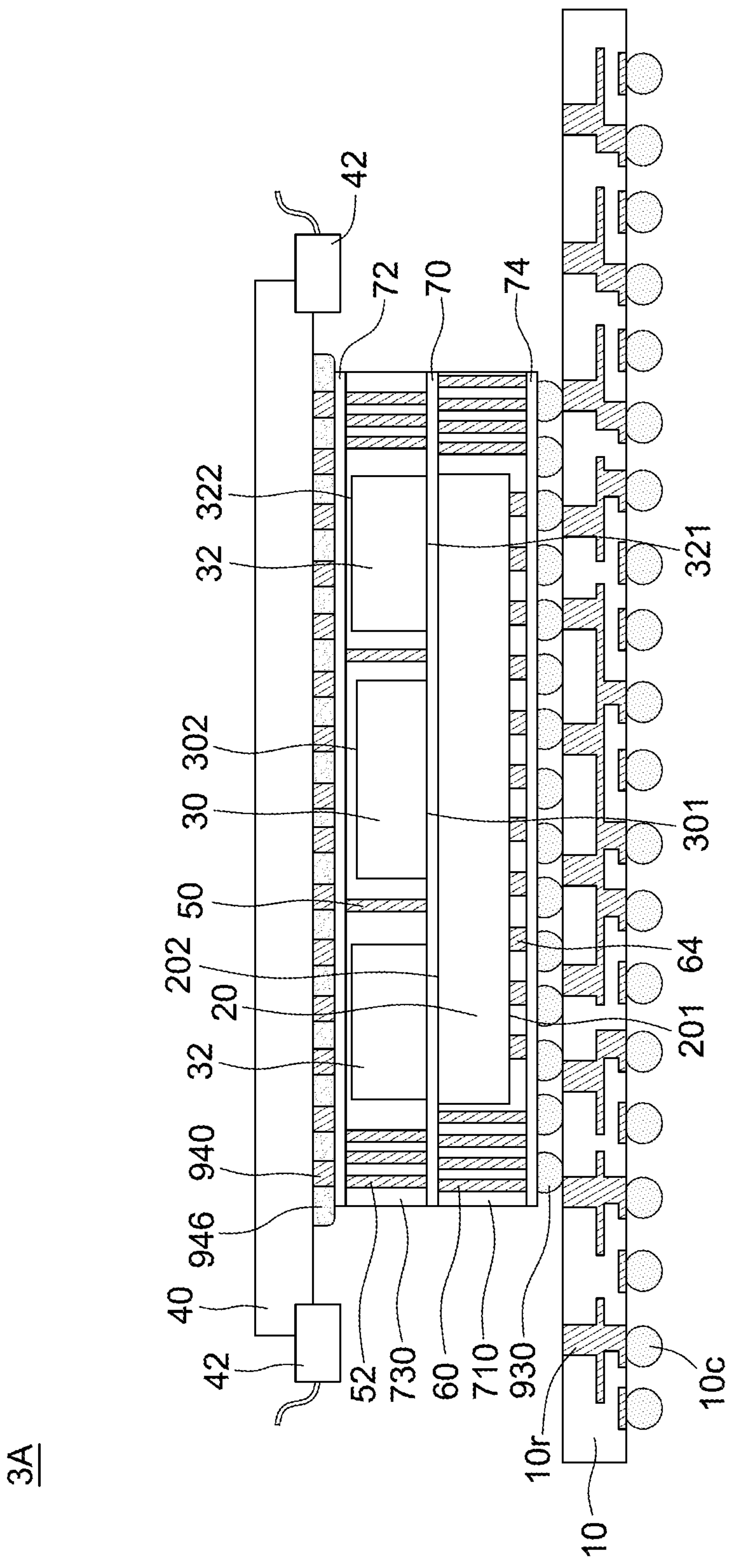

Referring to FIG. 9E, the structure illustrated in FIG. 9D may be bonded to a carrier through electrical contacts 930. The carrier 10 may include an interconnection structure 10*r* and electrical contacts 10*c*. As such, the optical device 3A is formed.

In some embodiments, referring to FIGS. 3 and 9E, an underfill 946 may not be formed to cover the connection elements 940. In some embodiments, referring to FIGS. 3 and 9E, conductive pads 942 may be further formed to have surfaces substantially coplanar with a surface of the RDL 72, and conductive pads 944 may be further formed to have surfaces substantially coplanar with a surface of the photonic component 40. As such, the optical device 3 illustrated in FIG. 3 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An optical device, comprising:

a processing component;

a first electronic component disposed over and electrically connected to the processing component;

a second electronic component disposed over the processing component and electrically connected to the first electronic component;

a first pillar disposed between the first electronic component and the second electronic component and electrically connected to the processing component;

a first encapsulant disposed over the processing component, wherein the first encapsulant encapsulates the first electronic component, the second electronic component, and the first pillar; and a first redistribution layer (RDL) disposed under the processing component, wherein the first RDL includes dummy conductive portions that are free from electrical connection, wherein the dummy conductive portions are connected to a backside surface of the processing component through an adhesive layer, such that heat generated by the processing component is dissipated through the dummy conductive portions of the first RDL.

2. The optical device as claimed in claim 1, further comprising:

a photonic component disposed over the first electronic component;

a second redistribution layer (RDL) disposed between the processing component and the first electronic component; and a plurality of second pillars surrounding the processing component, and disposed under the second RDL, wherein the first pillar and the plurality of second pillars are disposed on opposite sides of the second RDL, wherein the first pillar electrically connects the photonic component to the first electronic component, and the plurality of second pillars laterally overlap the processing component in a cross-sectional view.

3. The optical device as claimed in claim 2, wherein the first encapsulant disposed on a first side of the second RDL, the optical device further comprising a second encapsulant disposed on a second side of the second RDL opposite to the first side, wherein the second encapsulant encapsulates the processing component and the plurality of second pillars.

4. The optical device as claimed in claim 3, further comprising a third pillar disposed over and electrically connected to the second RDL, wherein a projection of the third pillar at least partially overlaps a projection of one of the plurality of second pillars from a top view perspective, wherein the third pillar is laterally separated from the first pillar by the first encapsulant, and wherein a diameter of the third pillar is less than a diameter of the first pillar.

5. The optical device as claimed in claim 1, further comprising:

a photonic component disposed over the first electronic component; and a heat dissipation structure disposed on the photonic component, and dissipating heat from the photonic component, wherein the photonic component dissipates heat along a first direction towards the heat dissipation structure in a first rate, and dissipates heat along a second direction opposite to the first direction in a second rate less than the first rate, wherein a width of the heat dissipation structure is greater than a width of the photonic component.

6. The optical device as claimed in claim 1, wherein the first electronic component, the second electronic component, and the first pillar are located within a projection of the processing component from a top view perspective.

7. The optical device as claimed in claim 6, wherein the first electronic component comprises at least a digital signal processing unit electrically connected to the second electronic component, and the second electronic component comprises at least one transimpedance amplifier (TIA) unit, and at least one driver (DRV) unit, or a combination thereof.

8. The optical device as claimed in claim 2, wherein the plurality of second pillars are configured to transmit a power to the processing component and the first electronic component.

9. The optical device as claimed in claim 2, wherein a first part of the second RDL is configured to transmit power to the processing component or the first electronic component, a second part of the second RDL is configured to transmit an electrical signal between the processing component and the first electronic component, and the first part of the second RDL is electrically insulated from the second part of the second RDL.

10. The optical device as claimed in claim 4, further comprising a fourth pillar disposed between and electrically connected to the processing component and the first electronic component, wherein the plurality of second pillars are configured to transmit a power to the processing component and the first electronic component, wherein the fourth pillar is configured to transmit an electrical signal between the processing component and the first electronic component, wherein the fourth pillar is encapsulated by the second encapsulant.

11. The optical device as claimed in claim 5, further comprising an optical fiber array component coupled to the photonic component, wherein the optical fiber array component is located outside of a projection of the processing component from a top view perspective.

12. The optical device as claimed in claim 11, wherein the optical fiber array component non-overlaps the processing component laterally from a cross-sectional view, and wherein the optical fiber array component includes a plurality of fiber array units (FAUs) and a waveguide.

13. The optical device as claimed in claim 1, wherein the adhesive layer is a thermal interface material (TIM).

14. An optical device, comprising:

a processing component;

a first electronic component disposed over and electrically connected to the processing component;

a second electronic component disposed over the processing component and electrically connected to the first electronic component;

a first pillar disposed between the first electronic component and the second electronic component and electrically connected to the processing component;

a first encapsulant disposed over the processing component, wherein the first encapsulant encapsulates the first electronic component, the second electronic component, and the first pillar;

a photonic component disposed over the first electronic component and electrically connected to the first electronic component through the first pillar;

a first redistribution layer (RDL) disposed between the processing component and the first electronic component; and a second pillar disposed under the first RDL, wherein the first pillar and the second pillar are disposed on opposite sides of the first RDL, wherein the first pillar electrically connects the photonic component to the first electronic component, and the second pillar laterally overlaps the processing component in a cross-sectional view.

15. The optical device as claimed in claim 14, further comprising:

a second redistribution layer (RDL) disposed between the photonic component and the first electronic component; and an optical fiber array component partially laterally overlapping the second RDL in a cross-sectional view.

16. The optical device as claimed in claim 14, wherein the photonic component covers the first electronic component and the second electronic component.

17. The optical device as claimed in claim 14, wherein the first electronic component is disposed between the photonic component and the processing component in a cross-sectional view.

18. The optical device as claimed in claim 14, wherein a projection of the first electronic component, a projection of the second electronic component, and a projection of the processing component are located within a range covered by the photonic component.

19. An optical device, comprising:

a processing component;

a first electronic component disposed over and electrically connected to the processing component;

a second electronic component disposed over the processing component and electrically connected to the first electronic component;

a first pillar disposed between the first electronic component and the second electronic component and electrically connected to the processing component;

a first redistribution layer (RDL) disposed between the processing component and the first electronic component;

a plurality of second pillars surrounding the processing component;

a first encapsulant disposed on a first side of the first RDL and encapsulating the first electronic component, the second electronic component, and the first pillar; and a second encapsulant disposed on a second side of the first RDL opposite to the first side, and encapsulating the processing component and the plurality of second pillars.

20. The optical device as claimed in claim 19, wherein a lateral surface of the first encapsulant is substantially aligned with a lateral surface of the second encapsulant.

* * * * *